US010658395B2

(12) United States Patent
Kimura et al.

(10) Patent No.: US 10,658,395 B2
(45) Date of Patent: May 19, 2020

(54) SEMICONDUCTOR DEVICE

(71) Applicant: Semiconductor Energy Laboratory Co., Ltd., Atsugi-shi, Kanagawa-ken (JP)

(72) Inventors: Hajime Kimura, Atsugi (JP); Tsutomu Murakawa, Isehara (JP); Kosei Nei, Yokohama (JP); Hiroaki Honda, Odawara (JP); Yusuke Shino, Atsugi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 15/925,122

(22) Filed: Mar. 19, 2018

(65) Prior Publication Data
US 2018/0286886 A1 Oct. 4, 2018

(30) Foreign Application Priority Data

Mar. 24, 2017 (JP) .................................. 2017-059440

(51) Int. Cl.
| H01L 27/12 | (2006.01) |
| H01L 29/786 | (2006.01) |
| H01L 21/84 | (2006.01) |
| G11C 11/404 | (2006.01) |
| H01L 27/06 | (2006.01) |

(Continued)

(52) U.S. Cl.
CPC ............ *H01L 27/124* (2013.01); *H01L 21/84* (2013.01); *H01L 27/1225* (2013.01); *H01L 27/1255* (2013.01); *H01L 29/7869* (2013.01); *H01L 29/78648* (2013.01); *H01L 29/78696* (2013.01); *G11C 11/404* (2013.01);
(Continued)

(58) Field of Classification Search
None
See application file for complete search history.

(56) References Cited

U.S. PATENT DOCUMENTS 5,744,864 A 4/1998 Cillessen et al.
8,385,105 B2 2/2013 Saito
(Continued)

FOREIGN PATENT DOCUMENTS

| JP | 63-239117 A | 10/1988 |
| JP | 11-505377 | 5/1999 |
| JP | 2008-218553 A | 9/2008 |

*Primary Examiner* — Telly D Green
(74) *Attorney, Agent, or Firm* — Robinson Intellectual Property Law Office; Eric J. Robinson

(57) ABSTRACT

A semiconductor device which can suppress leakage current between a wiring and a connection electrode connected to a floating node is provided. The semiconductor device includes a first insulator, a first conductor over the first insulator, a second conductor over the first insulator, and a second insulator over the first insulator, the first conductor, and the second conductor. The first conductor and the second conductor contain a metal A (one kind or a plurality of kinds of aluminum, copper, tungsten, chromium, silver, gold, platinum, tantalum, nickel, molybdenum, magnesium, beryllium, indium, and ruthenium). The metal A is detected in an interface between the first insulator and the second insulator by an energy dispersive X-ray spectroscopy (EDX). The second insulator includes a groove for exposing the first insulator between the first conductor and the second conductor.

10 Claims, 16 Drawing Sheets

(51) Int. Cl.
  *H01L 21/8258* (2006.01)
  *G11C 11/405* (2006.01)
(52) U.S. Cl.
  CPC ......... *G11C 11/405* (2013.01); *H01L 21/8258* (2013.01); *H01L 27/0688* (2013.01)

(56) References Cited

U.S. PATENT DOCUMENTS

| | | |
|---|---|---|
| 8,416,622 B2 | 4/2013 | Kamata |
| 8,575,985 B2 | 11/2013 | Ohmaru et al. |
| 8,687,416 B2 | 4/2014 | Kurokawa |
| 9,349,722 B2 | 5/2016 | Kurokawa |
| 9,424,923 B2 | 8/2016 | Nagatsuka et al. |
| 9,583,177 B2 | 2/2017 | Ishizu |
| 9,685,560 B2 * | 6/2017 | Yamazaki ........... H01L 29/7869 |
| 10,147,681 B2 * | 12/2018 | Yamazaki ............. H01L 27/016 |
| 2008/0211094 A1 | 9/2008 | Hirata |
| 2011/0089417 A1 | 4/2011 | Yamazaki et al. |
| 2011/0101351 A1 | 5/2011 | Yamazaki |
| 2014/0167041 A1 | 6/2014 | Yamazaki et al. |
| 2016/0253260 A1 | 9/2016 | Koyama |
| 2017/0271521 A1 * | 9/2017 | Yamazaki ........... H01L 29/7869 |
| 2017/0317111 A1 * | 11/2017 | Ando ................ H01L 29/78648 |
| 2018/0122950 A1 * | 5/2018 | Yamazaki ............. H01L 21/443 |
| 2018/0166392 A1 * | 6/2018 | Yamazaki ............. H01L 27/016 |

\* cited by examiner

SEMICONDUCTOR DEVICE

BACKGROUND OF THE INVENTION

1. Field of the Invention

One embodiment of the present invention relates to a semiconductor device. Another embodiment of the present invention relates to an electronic device.

Note that one embodiment of the present invention is not limited to the above technical field. One embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device generally means a device that can function by utilizing semiconductor characteristics. A semiconductor element such as a transistor, a semiconductor circuit, an arithmetic device, and a memory device are each an embodiment of a semiconductor device. It can be said that a display device (e.g., a liquid crystal display device and a light-emitting display device), a power generation device (e.g., a thin film solar cell and an organic thin film solar cell), a projection device, a lighting device, an electro-optical device, a power storage device, an imaging device, an electronic device, and the like include a semiconductor device in some cases.

2. Description of the Related Art

In recent years, a technique for forming an integrated circuit in which a layer provided with a transistor and a layer provided with a capacitor are stacked has attracted attention. The transistor and the capacitor are electrically connected to each other through a wiring and a plug formed between the layers to drive the integrated circuit.

For example, a wiring is formed in the same layer as a connection electrode connected to a floating node. To the wiring, a potential different from that of the connection electrode is applied. When the connection electrode and the wiring are formed over an insulator using a conductor, the residue of the conductor may remain over the insulator. Due to the residue, there is a possibility that leakage current is generated between the connection electrode connected to the floating node and the wiring formed in the same layer. Furthermore, also in the case where a wiring and another wiring to which a potential different from that of the wiring is applied are formed in the same layer, there is a possibility that the potential applied to the another wiring interferes with the potential applied to the wiring due to the residue in a region between the wirings.

In recent years, transistors including oxide semiconductors (typically, In—Ga—Zn oxide) have been actively developed and used in ICs and the like. Oxide semiconductors have been researched since early times. In 1988, there was a disclosure of a crystal In—Ga—Zn oxide that can be used for a semiconductor element (see Patent Document 1). In 1995, a transistor including an oxide semiconductor was invented, and its electrical characteristics were disclosed (see Patent Document 2).

REFERENCES

Patent Documents

[Patent Document 1] Japanese Published Patent Application No. S63-239117 [Patent Document 2] Japanese Translation of PCT International Application No. H11-505377

SUMMARY OF THE INVENTION

An object of one embodiment of the present invention is to block a leakage current path between a wiring and a memory cell included in a semiconductor device to improve retention characteristics of a memory.

Another object of one embodiment of the present invention is to provide a semiconductor device which can reduce leakage current between a wiring and a connection electrode connected to a floating node. Another object of one embodiment of the present invention is to provide a semiconductor device that can be miniaturized or highly integrated. Another object of one embodiment of the present invention is to provide a semiconductor device capable of retaining data for a long time. Another object of one embodiment of the present invention is to provide a semiconductor device which can reduce leakage current between wirings.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first insulator, a first conductor over the first insulator, a second conductor over the first insulator, and a second insulator over the first insulator, the first conductor, and the second conductor. The first conductor and the second conductor contain a metal A (one kind or a plurality of kinds of aluminum, copper, tungsten, chromium, silver, gold, platinum, tantalum, nickel, molybdenum, magnesium, beryllium, indium, and ruthenium). The metal A is detected in an interface between the first insulator and the second insulator by an energy dispersive X-ray spectroscopy (EDX). The second insulator includes a groove for exposing the first insulator between the first conductor and the second conductor.

In the above structure, it is preferable that a first transistor and a capacitor be included and the first conductor be electrically connected to one of a source and a drain of the first transistor and one electrode of the capacitor. Furthermore, in the above structure, a channel formation region of the first transistor is preferably formed in a metal oxide.

Another embodiment of the present invention is a semiconductor device including a first insulator, a first conductor over the first insulator, a second conductor over the first insulator, a second insulator over the first insulator, the first conductor, and the second conductor, and a capacitor. The first conductor and the second conductor contain a metal A (one kind or a plurality of kinds of aluminum, copper, tungsten, chromium, silver, gold, platinum, tantalum, nickel, molybdenum, magnesium, beryllium, indium, and ruthenium). The first conductor serves as one electrode of the capacitor. The metal A is detected in an interface between the first insulator and the second insulator by an EDX method. The second insulator includes a groove for exposing the first insulator between the first conductor and the second conductor.

In the above structure, it is preferable that a first transistor be included and the first conductor be electrically connected to one of a source and a drain of the first transistor. Furthermore, in the above structure, a channel formation region of the first transistor is preferably formed in a metal oxide.

In the above structure, it is preferable that a second transistor be included and the first conductor be electrically connected to a gate of the second transistor.

In the above structure, the first conductor and the second conductor contain at least one of Al and Cu.

Another embodiment of the present invention is a method for manufacturing a semiconductor device, including the steps of forming a first conductor over a first insulator, forming a resist mask in a pattern over the first conductor, etching the first conductor with the resist mask to form a second conductor and a third conductor, performing an impurity removal step on the first insulator after the formation of the second conductor and the third conductor, removing the resist mask, forming a second insulator over the first insulator, the second conductor, and the third conductor, and forming a groove for exposing the first insulator in the second insulator between the second conductor and the third conductor. The first conductor contains a metal A (one kind or a plurality of kinds of aluminum, copper, tungsten, chromium, silver, gold, platinum, tantalum, nickel, molybdenum, magnesium, beryllium, indium, and ruthenium).

In the above structure, the impurity removal step preferably includes washing treatment with pure water. Furthermore, in the above structure, the first conductor contains at least one of Al and Cu.

According to one embodiment of the present invention, the leakage current path between the wiring and the memory cell included in the semiconductor device is blocked and the retention characteristics of the memory are improved.

According to one embodiment of the present invention, a semiconductor device which can reduce the leakage current between the wiring and the connection electrode connected to a floating node is provided. Alternatively, a semiconductor device that can be miniaturized or highly integrated is provided. Alternatively, a semiconductor device capable of retaining data for a long time is provided. Alternatively, a semiconductor device which can reduce leakage current between wirings is provided.

Note that the description of these effects does not preclude the existence of other effects. One embodiment of the present invention does not have to have all the effects listed above. Other effects will be apparent from and can be derived from the description of the specification, the drawings, the claims, and the like.

DETAILED DESCRIPTION OF THE INVENTION

Figure 1A:
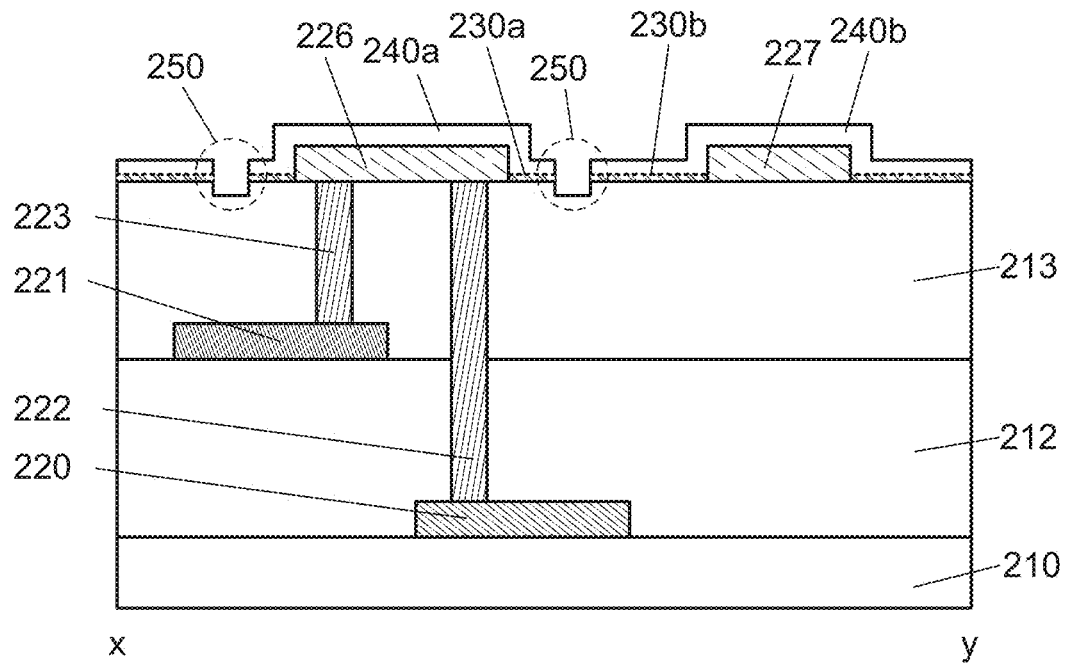
FIGS. 1A and 1B are a schematic cross-sectional view and a schematic top view illustrating a semiconductor device of one embodiment of the present invention.

Embodiments will be described below with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. In the drawings, the same portions or portions having similar functions are denoted by the same reference numerals in different drawings, and explanation thereof will not be repeated. Further, the same hatching pattern is applied to portions having similar functions, and the portions are not especially denoted by reference numerals in some cases.

Especially in a top view (also referred to as a "plan view"), some components might not be illustrated for easy understanding of the invention. In addition, some hidden lines and the like might not be shown.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement, such as "over", "above", "under", and "below", are used for convenience in describing a positional relation between components with reference to drawings. Further, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor includes a channel formation region between the drain (a drain terminal, a drain region, or a drain electrode) and the source (a source terminal, a source region, or a source electrode), and current can flow between the source and the drain through the channel formation region. Note that in this specification and the like, a channel formation region refers to a region through which current mainly flows.

Furthermore, functions of a source and a drain might be switched when a transistor of opposite polarity is employed or a direction of current flow is changed in circuit operation, for example. Therefore, the terms "source" and "drain" can be switched in this specification and the like.

Note that in this specification and the like, a silicon oxynitride film refers to a film in which the proportion of oxygen is higher than that of nitrogen. The silicon oxynitride film preferably contains oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, for example, the term "insulating film" can be changed into the term "insulating layer" in some cases.

Furthermore, unless otherwise specified, transistors described in this specification and the like are enhancement-type (normally-off-type) field-effect transistors. Unless otherwise specified, transistors described in this specification and the like are n-channel transistors. Thus, unless otherwise specified, the threshold voltage (also referred to as "Vth") is larger than 0 V.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "substantially parallel" indicates that the angle formed between two straight lines is greater than or equal to −30° and less than or equal to 30°. The term "perpendicular" indicates that the angle formed between two straight lines is greater than or equal to 80° and less than or equal to 100°, and accordingly also includes the case where the angle is greater than or equal to 85° and less than or equal to 95°. In addition, the term "substantially perpendicular" indicates that the angle formed between two straight lines is greater than or equal to 60° and less than or equal to 120°.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, and a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that allow an electrical connection between X and Y (e.g., a switch, a transistor, a capacitor, an inductor, a resistor, a diode, a display element, a light-emitting element, and a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that allow a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to a part of Z1 and another part of Z1 is directly connected to X while a drain (or a second terminal or the like) of the transistor is directly connected to a part of Z2 and another part of Z2 is directly connected to Y.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path", "a source (or a first terminal or the like) of a transistor is electrically connected to X through at least Z1 on a first connection path, the first connection path does not include a second connection path, the second connection path includes a connection path through the transistor, a drain (or a second terminal or the like) of the transistor is electrically connected to Y through at least Z2 on a third connection path, and the third connection path does not include the second connection path", and "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit configuration is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification, a barrier film refers to a film having a function of inhibiting the passage of oxygen and impurities such as hydrogen. The barrier film that has conductivity may be referred to as a conductive barrier film.

Embodiment 1

In this embodiment, structures and a manufacturing method of a semiconductor device of one embodiment of the present invention are described with reference to FIGS. 1A and 1B to FIGS. 10A to 10C. Note that in FIGS. 1A and 1B to FIGS. 10A to 10C, some components of the semiconductor device are not illustrated for clarity.

<Structure Examples of Semiconductor Device>

Figure 1B:
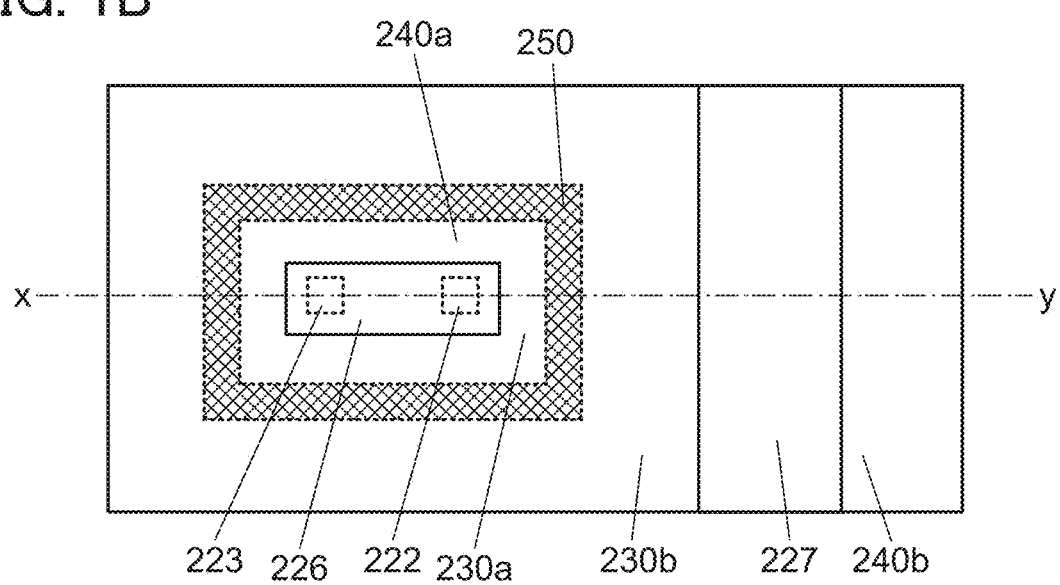

FIGS. 1A and 1B illustrate a part of a structure of a semiconductor device of one embodiment of the present invention. FIG. 1B is a schematic top view illustrating a structure of a semiconductor device. FIG. 1A corresponds to a schematic cross-sectional view taken along dashed-dotted line x-y in FIG. 1B. Note that in the top view such as FIG. 1B, a groove 250 is illustrated as a hatch pattern.

In the cross-sectional view such as FIG. 1A, end portions of some of patterned conductors, semiconductors, and insulators have right-angled corners; however, the semiconductor device in this embodiment is not limited thereto and can have rounded end portions.

The semiconductor device illustrated in FIGS. 1A and 1B includes a substrate 210, an insulator 212, an insulator 213, a conductor 220, a conductor 221, a conductor 222, a conductor 223, a conductor 226, a conductor 227, a film 240a, a film 240b, and the groove 250.

In the semiconductor device in FIGS. 1A and 1B, the conductor 220 is provided over the substrate 210. The insulator 212 is provided over the substrate 210 and the conductor 220 to cover the conductor 220. The conductor 221 is provided over the insulator 212. The insulator 213 is provided over the insulator 212 and the conductor 221 to cover the conductor 221. Furthermore, the conductor 226 and the conductor 227 are provided in the same layer over the insulator 213. The film 240a is provided over and to cover the conductor 226 and the film 240b is provided over and to cover the conductor 227. In addition, the groove 250 is provided in the insulator 213 between the conductor 226 and the conductor 227.

In the semiconductor device in FIGS. 1A and 1B, a first opening portion is provided in the insulator 212 and the insulator 213 to reach the conductor 220, and the conductor 222 is provided in the first opening portion. The conductor 220 is electrically connected to the conductor 226 through the conductor 222. Furthermore, in the semiconductor device in FIGS. 1A and 1B, a second opening portion is provided in the insulator 213 to reach the conductor 221, and the conductor 223 is provided in the second opening portion. The conductor 221 is electrically connected to the conductor 226 through the conductor 223. That is, the conductor 220 and the conductor 221 are electrically connected to each other through the conductor 226.

Note that the conductor 220 and the conductor 221 may be formed in the same layer. Alternatively, the conductor 221 may be formed in a layer under the conductor 220.

For example, the conductor 226 functions as a floating node (FN) or a connection electrode connected to the floating node in some cases. The conductor 227 may function as a wiring. For the wiring, a metal A with a low electric resistance value (a metal A is a metal material such as aluminum, copper, tungsten, chromium, silver, gold, platinum, tantalum, nickel, molybdenum, magnesium, beryllium, indium, or ruthenium) or a conductor containing a metal A is preferably used. In the case where a metal A or a conductor containing a metal A is used for the conductor 226 or the conductor 227, cleaning treatment is performed after the formation of the conductor 226 or the conductor 227 in some cases. In the cleaning treatment, the metal A may be slightly dissolved from the end portion of the conductor 226 or the conductor 227, and a residue 230 of the metal A (see FIG. 6) may be formed on the surface of the insulator 213.

Furthermore, after the conductor 226 or the conductor 227 is formed, a resist mask is removed by ashing or with a resist stripper. When the resist mask is removed, the metal A may be slightly dissolved from the end portion of the conductor 226 or the conductor 227, and the residue 230 of the metal A may be formed on the surface of the insulator 213. Note that the residue 230 of the metal A may be formed on the top surface or the side surface of the conductor 226 or the conductor 227.

The residue 230 of the metal A formed on the surface of the insulator 213 is too thin to be observed with a transmission electron microscope (TEM). With an EDX, the metal A is detected in a slight amount. However, due to the residue 230 of the metal A, leakage current may be generated between the conductor 226 and the conductor 227 which are formed in the same layer. For example, in the case where an extremely low leakage current, such as $10^{-21}$ A (zA) or $10^{-24}$ A (yA), is required, even when there is a small amount of residue 230 of the metal A, it is highly probable that leakage current is affected.

Figure 7:
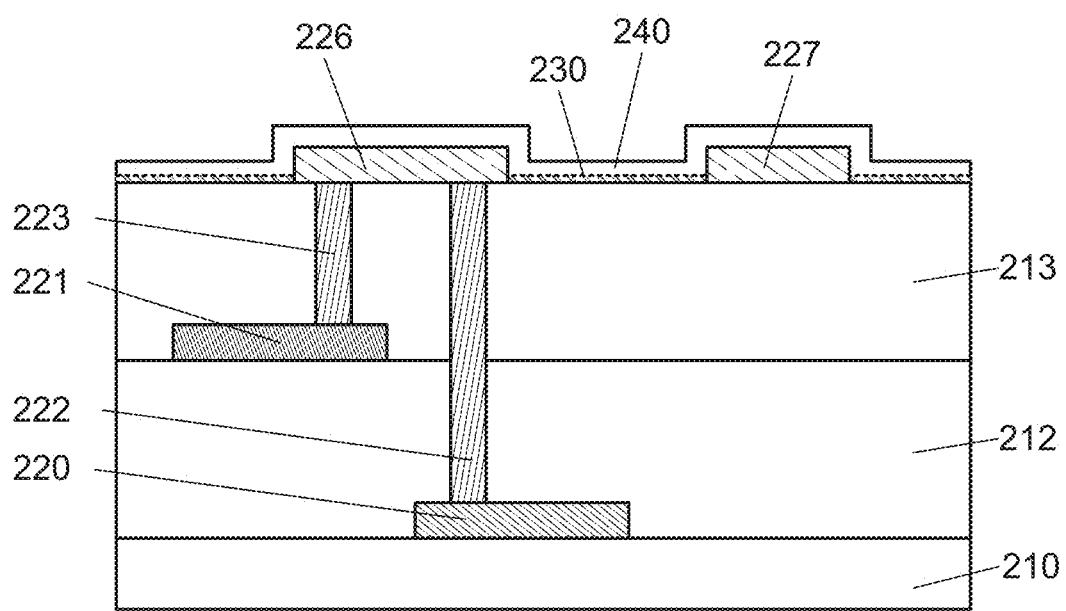
FIG. 7 is a schematic cross-sectional view illustrating a method for manufacturing a semiconductor device of one embodiment of the present invention.

Then, a film 240 is provided over the conductor 226, the conductor 227, and the insulator 213 (see FIG. 7). Next, in a region between the conductor 226 and the conductor 227, the groove 250 is provided in the film 240 and the insulator 213 to expose part of the insulator 213. Note that in this specification, the groove 250 is a region where at least part of the film 240 over the insulator 213 is removed. In the top view, the groove 250 is formed around the conductor 226, and in the cross-sectional view, the position of the bottom surface of the groove 250 is lower than that of the bottom surface (a surface in contact with the insulator 213) of the conductor 226.

When the groove 250 is formed, the residue 230 of the metal A which is on the surface of the insulator 213 in a region where the groove 250 is formed is removed together with the film 240. Thus, the residue 230 of the metal A can be separated into a residue 230a of the metal A and a residue 230b of the metal A. The film 240 is provided over the conductor 226, the conductor 227, and the insulator 213, whereby the formation of a residue of the metal A due to the dissolution of the metal A from the conductor 226, the conductor 227, and the residue 230 of the metal A when the groove 250 is formed can be prevented. Thus, leakage current between the conductor 226 and the conductor 227 through the residue 230 of the metal A can be reduced.

Figure 2:
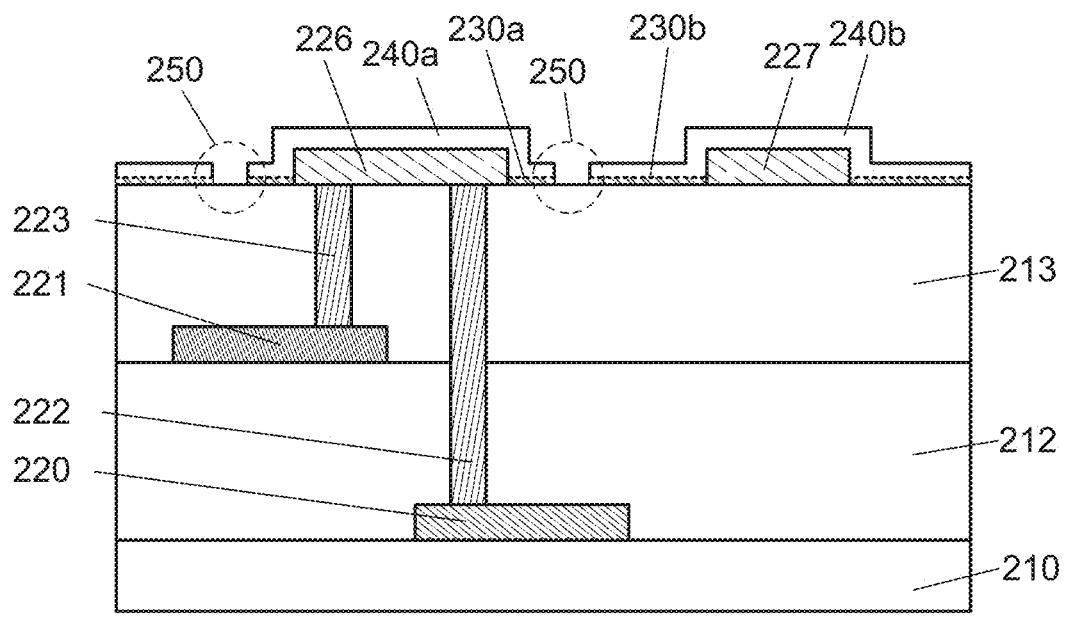
FIG. 2 is a schematic cross-sectional view illustrating a semiconductor device of one embodiment of the present invention.

Note that as illustrated in FIG. 2, part of the residue 230 of the metal A and the film 240 may be removed to expose the insulator 213. At this time, the position of the bottom surface of the groove 250 is the same as that of the bottom surface (the surface in contact with the insulator 213) of the conductor 226.

Figure 3A:
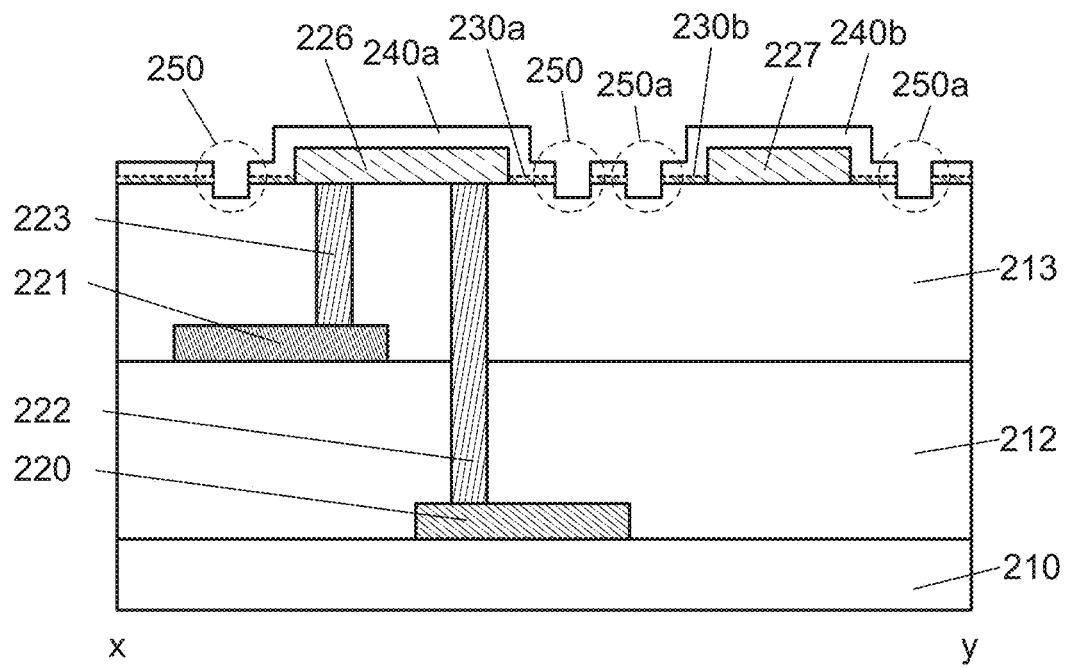
FIGS. 3A and 3B are a schematic cross-sectional view and a schematic top view illustrating a semiconductor device of one embodiment of the present invention.
Figure 3B:
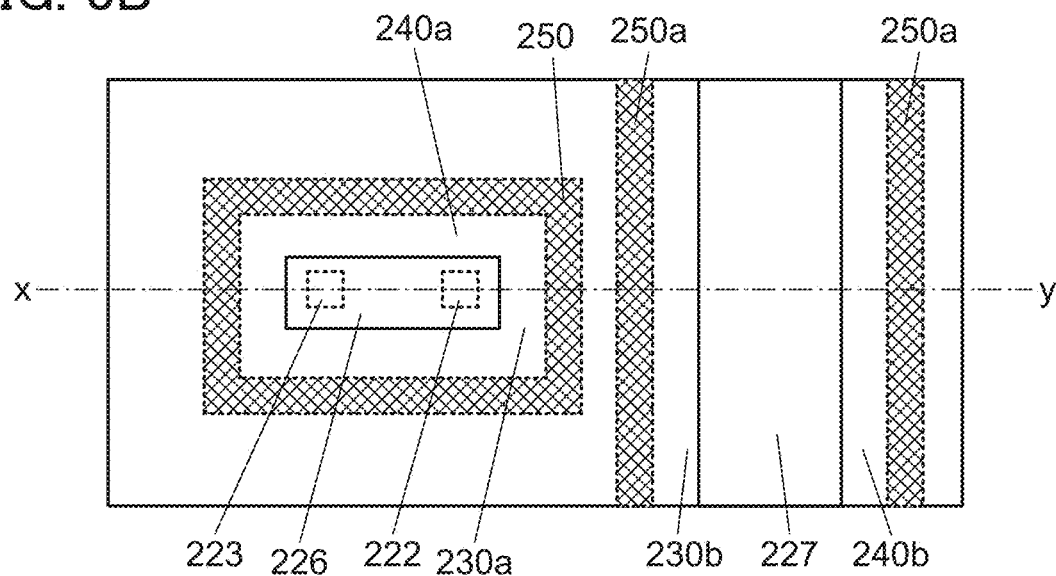

Alternatively, as illustrated in FIGS. 3A and 3B, the groove 250 may be formed around the conductor 226 and a groove 250a may be formed around the conductor 227. With such a structure, design flexibility can be improved when the grooves are formed around all of the conductors provided in the same layer as compared with when the groove is formed around only the conductor 226.

Figure 4A:
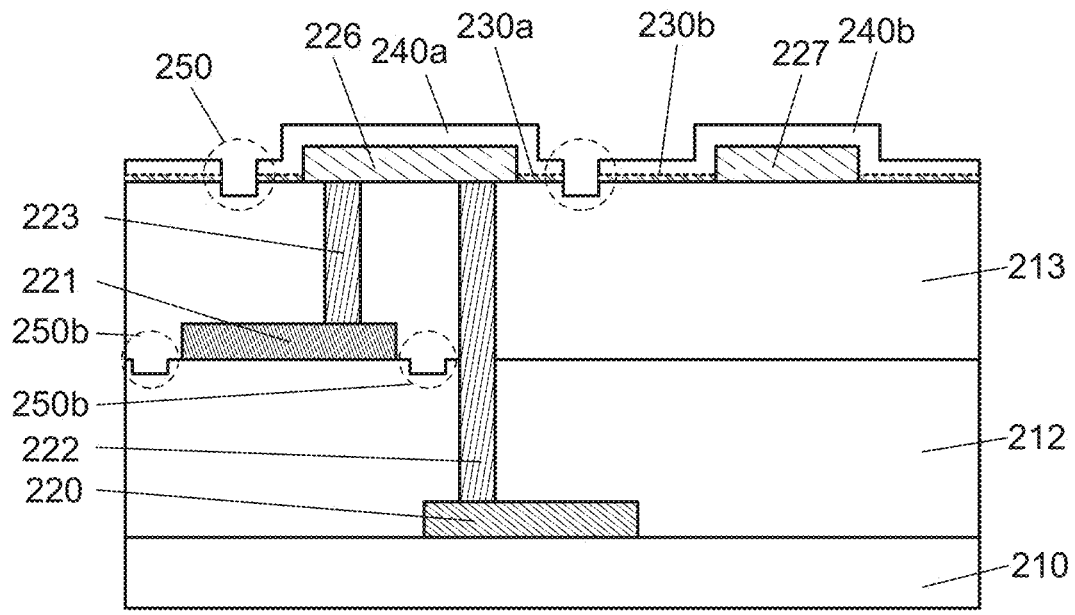
FIGS. 4A and 4B are schematic cross-sectional views each illustrating a semiconductor device of one embodiment of the present invention.

Alternatively, as illustrated in FIG. 4A, a groove 250b may be formed around the conductor 221. With such a structure, leakage current between the conductor 221 and a conductor (not illustrated) provided in the same layer as the conductor 221 can be reduced. Note that in FIG. 4A, the groove 250 is formed around the conductor 226; however, the groove 250a may be formed around the conductor 227 instead of the groove 250.

Figure 4B:
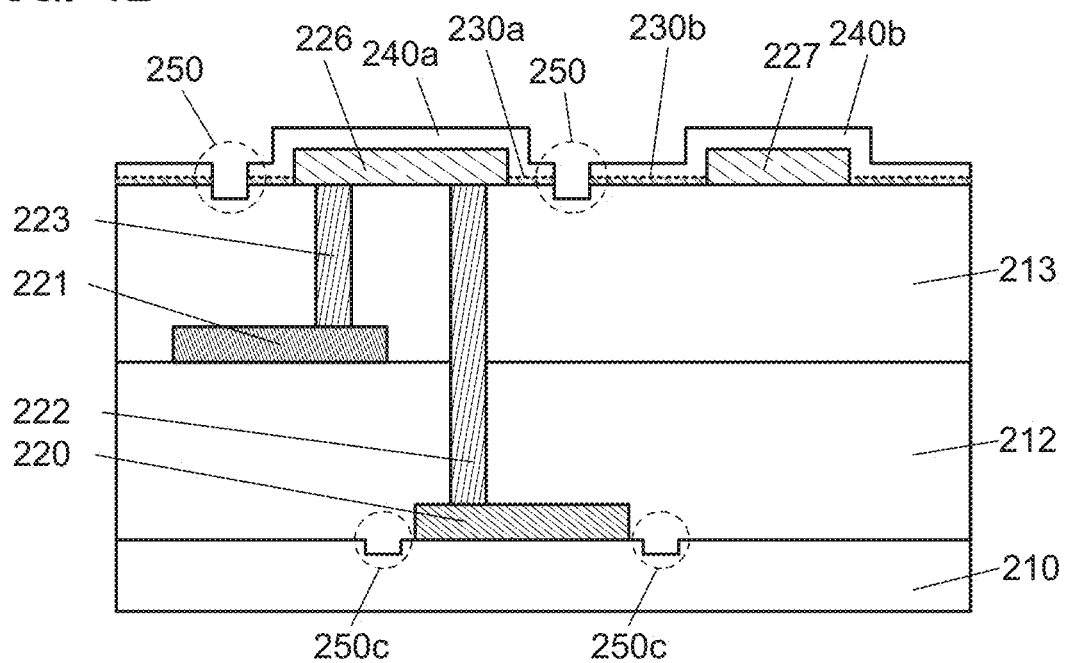

Alternatively, as illustrated in FIG. 4B, a groove 250c may be formed around the conductor 220. With such a structure, leakage current between the conductor 220 and a conductor (not illustrated) provided on the same layer as the conductor 220 can be reduced. Note that in FIG. 4B, the groove 250 is formed around the conductor 226; however, the groove 250a may be formed around the conductor 227 instead of the groove 250.

Furthermore, for example, the conductor 222, the conductor 223, and the conductor 226 can be provided as one conductor by a damascene method or a dual damascene method. By using a damascene method or a dual damascene method, copper can be used as a conductive material serving as the conductor 222, the conductor 223, and the conductor 226.

Note that in the above case, the conductor serving as the conductor 222, the conductor 223, and the conductor 226 is provided to be embedded in the insulator 212 and the insulator 213. Moreover, the conductor 227 provided in the same process may be embedded in the insulator 213. The damascene method or the dual damascene method includes a step of stacking conductors and removing a conductor other than a wiring portion and a conductor portion by a chemical mechanical polishing (CMP) method. In the CMP treatment, copper used for the conductor serving as the conductor 222, the conductor 223, and the conductor 226 is slightly left on the surface of the insulator 213 in some cases. Due to the residue, leakage current may be generated between the conductor serving as the conductor 222, the conductor 223, and the conductor 226, and the conductor 227 which is formed adjacently.

Thus, the film 240 is provided over the conductor serving as the conductor 222, the conductor 223, and the conductor 226, the conductor 227, and the insulator 213. In the region between the conductor 227 and the conductor serving as the conductor 222, the conductor 223, and the conductor 226, the groove 250 is formed in the film 240 and the insulator 213 to expose part of the insulator 213. In this case, in the top view, the groove 250 is formed around the conductor serving as the conductor 222, the conductor 223, and the conductor 226, and in the cross-sectional view, the position of the bottom surface of the groove 250 is lower than that of the top surface of the conductor serving as the conductor 222, the conductor 223, and the conductor 226 (the same surface as the top surface of the insulator 213). Thus, leakage current between the conductor 227 and the conductor serving as the conductor 222, the conductor 223, and the conductor 226 through the residue of the copper can be reduced.

Note that part of the residue of the copper and the film 240 may be removed to expose the insulator 213. At this time, the position of the bottom surface of the groove 250 is the same as that of the top surface of the conductor serving as the conductor 222, the conductor 223, and the conductor 226 (the same surface as the top surface of the insulator 213).

<Method for Manufacturing Semiconductor Device>

Figure 5:
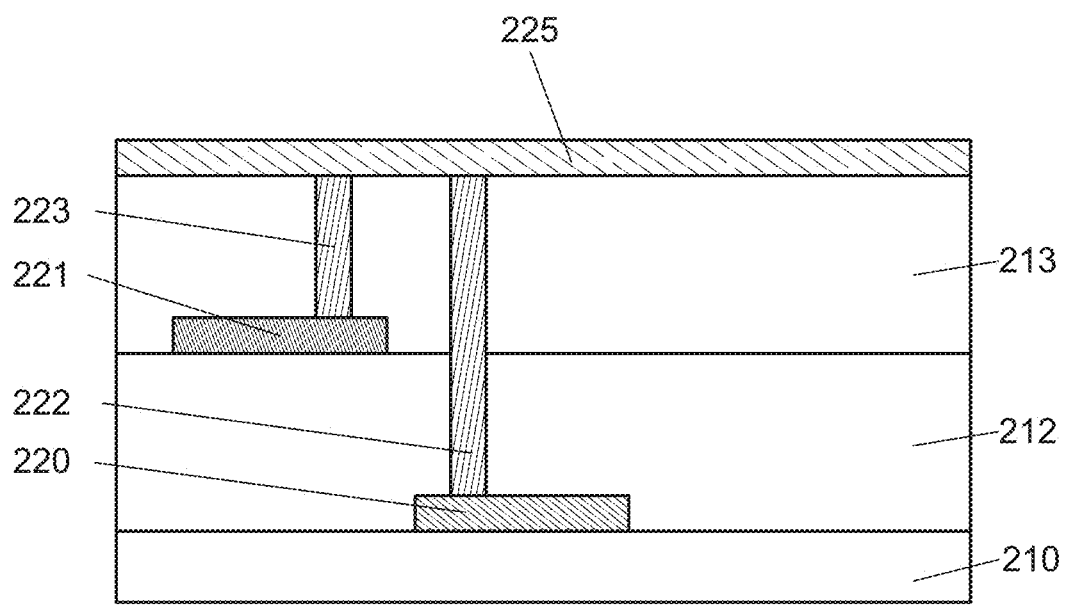
FIG. 5 is a schematic cross-sectional view illustrating a method for manufacturing a semiconductor device of one embodiment of the present invention.
Figure 6:
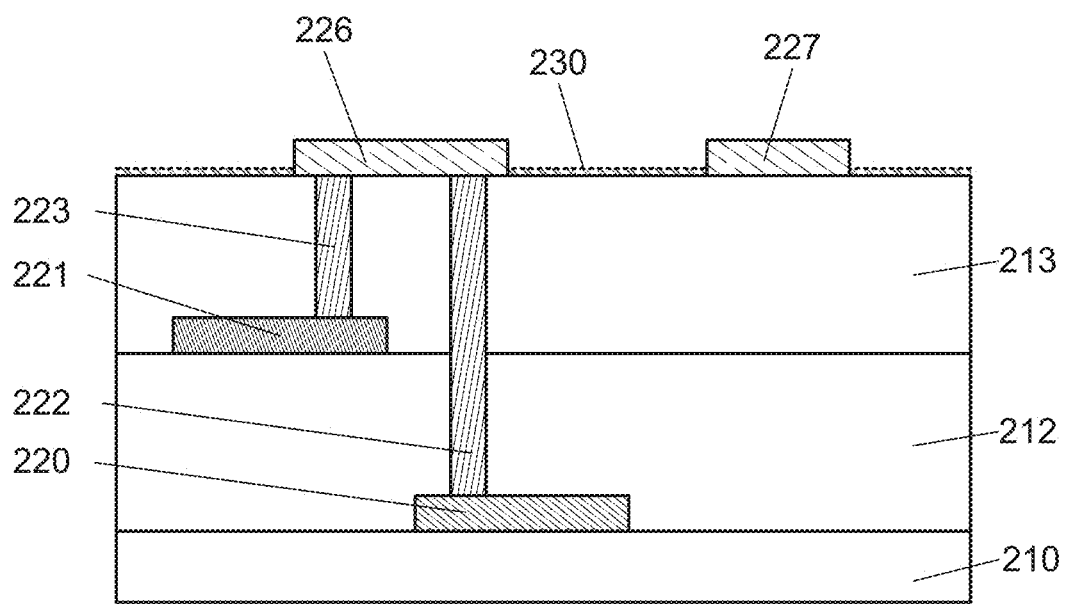
FIG. 6 is a schematic cross-sectional view illustrating a method for manufacturing a semiconductor device of one embodiment of the present invention.

A method for manufacturing a semiconductor device of one embodiment of the present invention is described below with reference to FIGS. 1A and 1B, FIG. 5, FIG. 6, and FIG. 7. FIG. 5, FIG. 6, and FIG. 7 are each a schematic cross-sectional view illustrating a method for manufacturing a semiconductor device of one embodiment of the present invention. With reference to FIGS. 1A and 1B, FIG. 5, FIG. 6, and FIG. 7, a process for forming the groove 250 between the conductor 226 and the conductor 227 which are provided in the same layer is described.

First, a substrate 210 is prepared.

The conductor 220 is formed over the substrate 210. The conductor 220 may have either a single-layer structure or a stacked-layer structure. In addition, an insulator and the like may be provided between the substrate 210 and the conductor 220.

Next, the insulator 212 is formed over and to cover the conductor 220. The insulator 212 may have either a single-layer structure or a stacked-layer structure. The insulator 212 can be deposited by a sputtering method, a chemical vapor deposition (CVD) method, a molecular beam epitaxy (MBE) method, a pulsed laser deposition (PLD) method, an atomic layer deposition (ALD) method, or the like.

CVD methods can be classified into a plasma enhanced CVD (PECVD) method using plasma, a thermal CVD (TCVD) method using heat, a photo CVD method using light, and the like. Moreover, the CVD methods can be classified into a metal CVD (MCVD) method and a metal organic CVD (MOCVD) method depending on a source gas.

The insulator 212 may be formed to have a flat top surface. For example, the top surface of the insulator 212 may have flatness at the time of forming the insulator 212. Alternatively, for example, the insulator 212 may have flatness by removing the insulator 212 from the top surface after the film formation so that the top surface becomes parallel to a reference surface such as a rear surface of the substrate. Such treatment is referred to as planarization treatment. As the planarization treatment, for example, CMP treatment, dry etching treatment, or the like can be performed. Note that the top surface of the insulator 212 does not necessarily have flatness.

Next, the conductor 221 is formed over the insulator 212. The conductor 221 may have either a single-layer structure or a stacked-layer structure.

Next, the insulator 213 is formed over and to cover the conductor 221. Note that the insulator 213 may have either a single-layer structure or a stacked-layer structure. Furthermore, the insulator that can be used as the insulator 212 is referred to for the insulator 213. Note that the insulator 213 may be formed to have a flat top surface, like the insulator 212.

Next, a second opening portion which reaches the conductor 221 is formed in the insulator 213. In addition, a first opening portion which reaches the conductor 220 is formed in the insulator 212 and the insulator 213. Hereinafter, an opening portion is referred to as a via hole or a contact hole in some cases.

The first opening portion and the second opening portion are each a via hole where a plug is provided and are each required to have a high aspect ratio in many cases. Thus, an anisotropic dry etching is preferably used for formation of the first opening portion and the second opening portion.

Then, the conductor 223 is formed to be embedded in the second opening portion. In addition, the conductor 222 is formed to be embedded in the first opening portion. Hereinafter, the conductor 222 and the conductor 223 are each referred to as a plug in some cases. As materials of the conductors 222 and 223, a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

The first opening portion and the second opening portion may be formed at a time or may be formed through different processes. Furthermore, the conductors 222 and 223 may be formed at a time or may be formed through different processes.

Here, a method for forming the first opening portion and the second opening portion through different processes and forming the conductors 222 and 223 through different processes is described.

For example, after the insulator 212 is formed, an opening portion to be the first opening portion that reaches the conductor 220 is formed in the insulator 212, and a first conductor is formed in the opening portion to be the first opening portion. Then, when the conductor 221 is formed, a conductor to be a plug or a wiring is formed over and in contact with the first conductor. Then, the insulator 213 is formed over the conductor to be the plug or the wiring, the insulator 212, and the conductor 221. In the insulator 213, an opening portion to be the first opening portion that reaches the conductor to be the plug or the wiring and the second opening portion that reaches the conductor 221 are formed at the same time. Then, a second conductor and the conductor 223 are formed at the same time in the opening portion to be the first opening portion and the second opening portion, respectively. Through these steps, the first conductor, the conductor to be the plug or the wiring, and the second conductor are connected to each other, whereby the conductor 222 can be formed.

Next, the insulator 213, the conductor 222, and the conductor 223 may be subjected to polishing treatment. As the polishing treatment, mechanical polishing, chemical polishing, CMP, or the like is performed.

The conductor 225 is deposited over the insulator 213, the conductor 222, and the conductor 223 (see FIG. 5). The conductor 225 may have either a single-layer structure or a stacked-layer structure. As the conductor 225 part of which is used as a wiring, a metal A with a low electric resistance value (a metal A is a metal material such as aluminum, copper, tungsten, chromium, silver, gold, platinum, tantalum, nickel, molybdenum, magnesium, beryllium, indium, or ruthenium) or a conductor containing a metal A is preferably used.

A resist mask is formed in a pattern over the conductor 225. The resist mask is formed by a lithography method or the like.

In the lithography method, first, a resist is exposed to light through a photomask. Next, a region exposed to light is removed or left using a developing solution, so that a resist mask is formed. Then, etching is conducted with the resist mask. As a result, a conductor, a semiconductor, an insulator, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a photomask is not necessary in the case of using an electron beam or an ion beam. Note that dry etching treatment such as ashing or wet etching treatment can be used for removal of the resist mask. Alternatively, wet etching treatment is performed in addition to dry etching treatment. Further alternatively, dry etching treatment can be performed in addition to wet etching treatment.

Next, the conductor 225 is partly etched with the resist mask until the top surface of the insulator 213 is exposed, whereby the conductor 226 and the conductor 227 are formed (see FIG. 6). Dry etching is preferably used as the etching.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel plate type electrodes. Alternatively, the capacitively coupled plasma etching apparatus may have a structure in which high-frequency power sources with different frequencies are applied to the parallel plate type electrodes. Alternatively, a dry etching apparatus including a high-density plasma source can be used. As the dry etching apparatus including a high-density plasma source, an inductively coupled plasma (ICP) etching apparatus can be used, for example.

The resist mask is removed after the etching. For removal of the resist mask, dry etching treatment such as ashing or wet etching treatment using a dedicated stripper or the like can be used. Alternatively, wet etching treatment is performed in addition to dry etching treatment. Further alternatively, dry etching treatment can be performed in addition to wet etching treatment.

In some cases, treatment such as dry etching performed in the above process causes the attachment or diffusion of impurities due to an etching gas or the like to a surface or the inside of the insulator 213 or the like. The impurity is fluorine or chlorine, for example.

A step of removing the above impurities and the like is performed. For example, cleaning treatment is preferably performed. As the cleaning, any of wet cleaning using a cleaning solution or the like, plasma treatment using plasma, cleaning by heat treatment, and the like may be performed by itself or in appropriate combination.

The wet cleaning may be performed using an aqueous solution in which oxalic acid, phosphoric acid, hydrofluoric acid, or the like is diluted with carbonated water or pure water. Alternatively, ultrasonic cleaning using pure water or carbonated water may be performed.

Side surfaces of the conductor 226 and the conductor 227 are substantially perpendicular to the top surface of the insulator 213 in FIG. 6; however, the semiconductor device in this embodiment is not limited thereto. For example, the conductors 226 and 227 may each have a tapered shape in which its side surface is inclined at an angle larger than or equal to 30° and smaller than 90° to the top surface of the insulator 213.

After the conductors 226 and 227 are formed by etching the conductor 225, cleaning is performed in some cases to prevent corrosion of the conductors 226 and 227. After the step of cleaning, the step of removing the resist mask, and the like, as illustrated in FIG. 6, the residue 230 of the metal A may be formed on the surfaces of the insulator 213, the conductor 226, and the conductor 227. It is highly probable that leakage current is generated between the conductor 226 to be a connection electrode and the conductor 227 to be a wiring through the residue 230 of the metal A.

Thus, as illustrated in FIG. 7, the film 240 is formed over the insulator 213, the residue 230 of the metal A, the conductor 226, and the conductor 227. An insulator can be used for the film 240, for example. Furthermore, a semiconductor or a conductor may be used.

Next, the groove 250 that reaches the insulator 213 is formed by removing part of the surface of the insulator 213, the residue 230 of the metal A, and the film 240 in a region overlapping with the groove 250 to surround the conductor 226 when seen from above (see FIG. 1B). By forming the groove 250, the film 240 is divided into the film 240a and the film 240b. For example, as a material of the film 240, a material that is similar to the material of the insulator 213 is preferably used. Alternatively, a material with which both of the insulator 213 and the film 240 are removed by the same method is preferably used. Thus, when the groove 250 is formed, the film 240 and part of the surface of the insulator 213 in a region overlapping with the groove 250 can be removed at a time. Furthermore, as a material of the film 240, a material not containing the metal A is preferably used. Alternatively, a material containing the metal A can be used as the material of the film 240 as long as the residue of the metal A is not formed after the film 240 in a region overlapping with the groove 250 is removed. Note that the grooves 250 formed in part of the surface of the insulator 213, the residue 230 of the metal A, and the film 240 may be formed through different processes.

In this manner, the residue 230 of the metal A can be divided into the residue 230a of the metal A formed between the insulator 213 and the film 240a and the conductor 226 and the film 240a and the residue 230b of the metal A formed between the insulator 213 and the film 240b and the conductor 227 and the film 240b. That is, the electrical connection between the conductor 226 and the conductor 227 through the residue 230 of the metal A can be blocked.

Through the above steps, the semiconductor device of one embodiment of the present invention can be fabricated.

When the groove 250 is provided, leakage current between the conductor 226 and the conductor 227 can be reduced.

In addition, when the groove 250 is provided, a distance between the conductors 226 and 227 can be reduced. Thus, a semiconductor device that can be miniaturized or highly integrated can be provided.

<Specific Example of Semiconductor Device>

A specific example of a structure of a semiconductor device of one embodiment of the present invention is described below with reference to FIGS. 1A and 1B.

Here, the case where the conductor 220 is one of components of a transistor and the conductor 221 is one of components of a capacitor is described.

For example, the conductor 220 functions as one of a source (a source region or a source electrode) and a drain (a drain region or a drain electrode) of a transistor and the conductor 221 functions as one electrode of a capacitor. Furthermore, the conductor 227 functions as a wiring. The conductor 226, which is electrically connected to one of the source and the drain of the transistor and one electrode of the capacitor, is referred to as a connection electrode in some cases. Note that the functions of the conductor 221 and the conductor 220 may be replaced with each other.

Here, the groove 250 is provided to surround the conductor 226 when seen from above. For example, as illustrated in FIG. 1B, the groove 250 is provided to surround the outer periphery of the conductor 226. Note that the groove 250 is provided between at least the conductor 226 and another conductor formed in the same layer and is not necessarily provided along the outer periphery of the conductor 226. For example, the groove 250 may be provided in a rectangular pattern so that the conductor 226 having a shape other than a rectangular is located inward from the groove 250. Furthermore, the shape of the groove 250 can be, regardless of the shape of the conductor 226, a quadrangular shape, a polygonal shape other than a quadrangular shape, a circular shape, or a closed shape having a curve.

The width of the groove 250 is designed in accordance with a semiconductor device which is to be fabricated. In accordance with a voltage applied to the conductors 226 and 227, a distance with which leakage current is not generated is kept. Furthermore, only the film 240a over the conductor 226 may be left, and the film 240b and part of the surface of the insulator 213 in a region not overlapping with the film 240a may be removed.

With the above structure, charges (voltage input to the floating node (FN)) stored in a capacitor of a memory cell included in the semiconductor device can be retained for a long time. In addition, a transistor including an oxide semiconductor in which an off-state current is extremely low is provided in a memory cell, whereby charges (voltage input to the floating node (FN)) stored in a capacitor of a memory cell can be retained for a long time.

Thus, a semiconductor device capable of retaining data for a long time can be provided.

In the above-described structure of the semiconductor device, one of the conductor 220 and the conductor 221 functions as one of the source and the drain of the transistor and the other of the conductor 220 and the conductor 221 functions as one electrode of the capacitor; however, one embodiment of the present invention is not limited thereto. For example, one of the conductor 220 and the conductor 221 functions as one of the source and the drain of the transistor and one electrode of the capacitor and the other of the conductor 220 and the conductor 221 is not formed in some cases. Alternatively, for example, one of the conductor 220 and the conductor 221 functions as one of the source and the drain of the transistor, the conductor 226 functions as one electrode of the capacitor, and the other of the conductor 220 and the conductor 221 is not formed in some cases.

Furthermore, in the structure example of this embodiment, the semiconductor device includes a transistor and a capacitor; however, one embodiment of the present invention is not limited thereto. For example, the semiconductor device may include a first transistor, a capacitor, and a second transistor. For example, one of the conductor 220 and the conductor 221 functions as one of a source and a drain of the first transistor and one electrode of the capacitor and the other of the conductor 220 and the conductor 221 functions as a gate of the second transistor in some cases. Alternatively, for example, one of the conductor 220 and the conductor 221 functions as one of the source and the drain of the first transistor, the other of the conductor 220 and the conductor 221 functions as the gate of the second transistor, and the conductor 226 functions as one electrode of the capacitor in some cases.

<Structure Example of Transistor>

A structure example of a transistor provided in a semiconductor device in this embodiment is described with reference to FIGS. 8A to 8C.

The transistor preferably has a low leakage current in an off state (off-state current). When a transistor having a low off-state current is used, charges applied to one electrode of the capacitor electrically connected to one of the source and the drain of the transistor through the connection electrode can be retained for a long time. As an example of a transistor with a low off-state current, a transistor including an oxide semiconductor in a channel formation region (an oxide semiconductor transistor) can be given. An oxide semiconductor transistor has a low off-state current and can be manufactured to overlap with a transistor including silicon, for example. An oxide semiconductor transistor is used as a transistor provided in the semiconductor device in this embodiment, whereby the data retention performance of the semiconductor device in this embodiment can be improved.

Figure 8A:
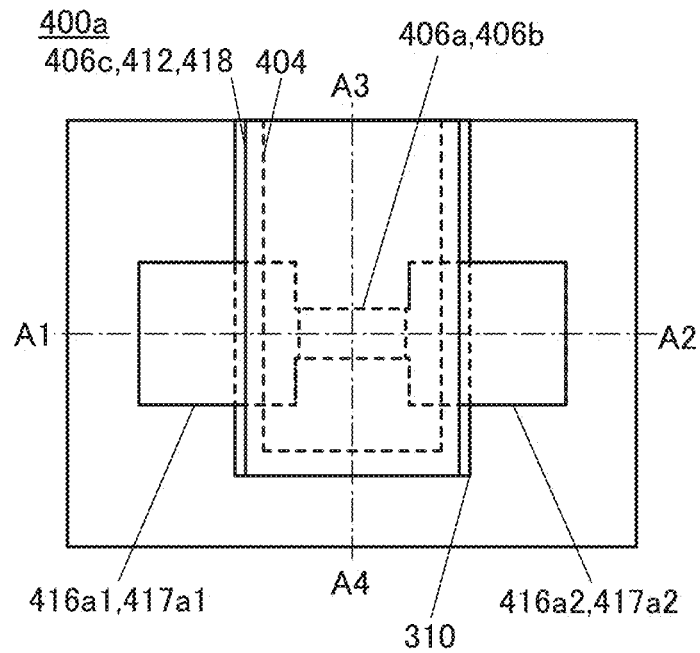
FIGS. 8A to 8C illustrate a transistor used in a semiconductor device of one embodiment of the present invention.

FIG. 8A is a top view of a transistor 400a included in a semiconductor device in this embodiment. FIG. 8B is a cross-sectional view taken along the dashed-dotted line A1-A2 in FIG. 8A. That is, FIG. 8B is a cross-sectional view in the channel length direction of the transistor 400a. FIG. 8C is a cross-sectional view taken along dashed-dotted line A3-A4 in FIG. 8A. That is, FIG. 8C is a cross-sectional view in the channel width direction of the transistor 400a. For simplification of the drawing, some components are not illustrated in the top view in FIG. 8A. The channel length direction of a transistor refers to a direction in which a carrier moves between a source (a source region or a source electrode) and a drain (a drain region or a drain electrode) in a plane parallel to a substrate, and the channel width direction refers to a direction perpendicular to the channel length direction in a plane parallel to a substrate.

Figure 8C:
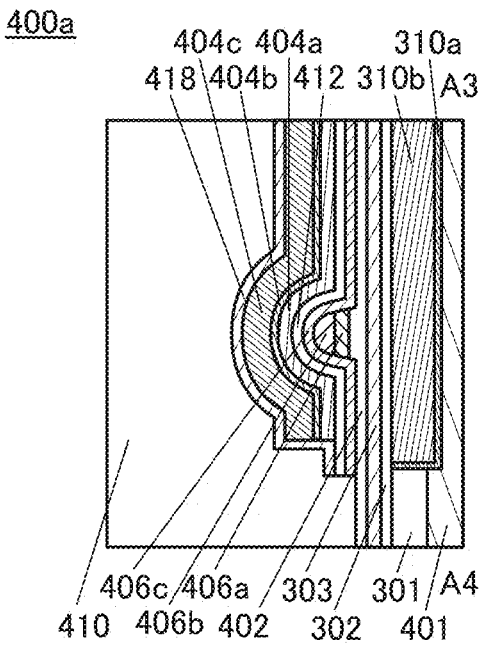
Figure 8B:
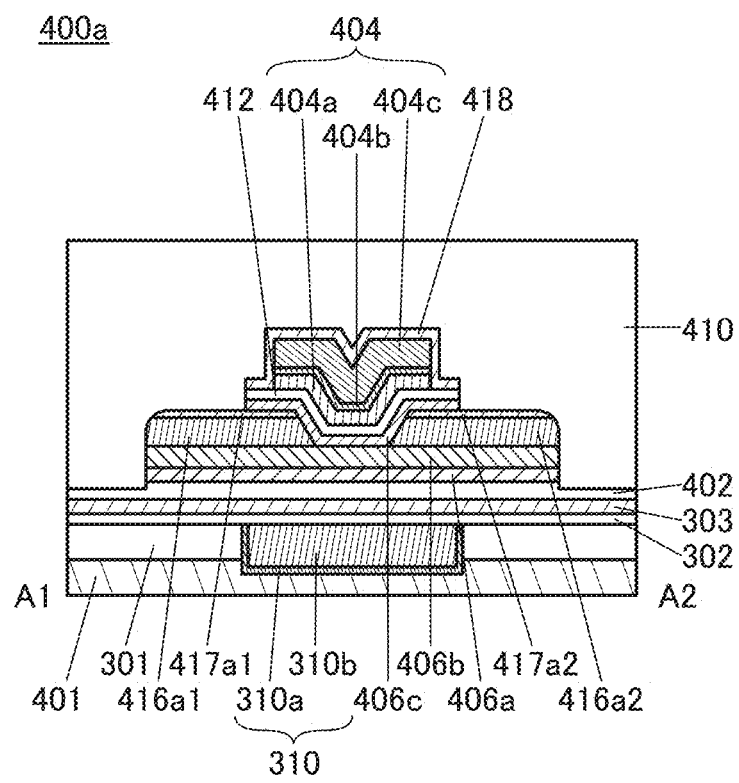

As illustrated in FIGS. 8A to 8C, the transistor 400a includes an insulator 401 and an insulator 301 which are provided over a substrate (not illustrated); a conductor 310 (a conductor 310a and a conductor 310b) embedded in the insulator 301; an insulator 302, an insulator 303, and an insulator 402 over the conductor 310; an oxide 406a over the insulator 402; an oxide 406b over the oxide 406a; a conductor 416a1 and a conductor 416a2 that are separate from each other over the oxide 406b; an oxide 406c over the oxide 406b, the conductor 416a1, and the conductor 416a2; an insulator 412 over the oxide 406c; and a conductor 404 (a conductor 404a, a conductor 404b, and a conductor 404c) at least part of which overlaps with the oxide 406b and which is over the insulator 412.

Furthermore, an insulator 410 is provided over the insulator 402, the oxide 406a, the oxide 406b, the oxide 406c, the conductor 416a1, the conductor 416a2, the insulator 412, the conductor 404, and the like.

The conductor 310 is provided in an opening formed in the insulator 301. The conductor 310a is formed in contact with an inner wall of the opening in the insulator 301, and the conductor 310b is formed on the inner side. Here, the top surfaces of the conductors 310a and 310b can have substantially the same level as the top surface of the insulator 301. The conductor 310 functions as one gate electrode.

Here, a conductive material that is relatively impermeable to impurities such as water and hydrogen is preferably used for the conductor 310a. For example, a single layer or a stacked layer of tantalum, tantalum nitride, ruthenium, ruthenium oxide, or the like is preferably used. Accordingly, diffusion of impurities such as water and hydrogen from a layer under the insulator 401 into an upper layer through the conductor 310 can be suppressed. Note that it is preferable that the conductor 310a be relatively impermeable to at least one of impurities such as a hydrogen atom, a hydrogen molecule, a water molecule, an oxygen atom, an oxygen molecule, a nitrogen atom, a nitrogen molecule, a nitrogen oxide molecule (e.g., $N_2O$, NO, and $NO_2$), and a copper atom. Furthermore, hereinafter, the same applies to the description of a conductive material that is relatively impermeable to impurities. When the conductor 310a has a function of inhibiting passage of oxygen, the conductivity of the conductor 310b can be prevented from being lowered because of oxidation.

The insulator 401 can serve as a barrier insulating film for preventing impurities such as water and hydrogen from entering the transistor from a lower layer. The insulator 401 is preferably formed using an insulating material that is relatively impermeable to impurities such as water and hydrogen, and for example, is preferably formed using aluminum oxide or the like. Accordingly, impurities such as water and hydrogen can be prevented from being diffused into layers over the insulator 401. Note that it is preferable that the insulator 401 be relatively impermeable to at least one of impurities such as a hydrogen atom, a hydrogen molecule, a water molecule, a nitrogen atom, a nitrogen molecule, a nitrogen oxide molecule (e.g., $N_2O$, NO, and $NO_2$), and a copper atom. Furthermore, hereinafter, the same applies to the description of an insulating material that is relatively impermeable to impurities.

Moreover, the insulator 401 is preferably formed using an insulating material that is relatively impermeable to oxygen (e.g., an oxygen atom or an oxygen molecule). With this material, oxygen contained in the insulator 402 or the like can be prevented from being diffused to lower layers. Thus, oxygen can be supplied to the oxide 406b effectively.

The insulator 303 is preferably formed using an insulating material that is relatively impermeable to oxygen and impurities such as water and hydrogen, and is preferably formed using aluminum oxide, hafnium oxide, or the like. Accordingly, diffusion of impurities such as water and hydrogen from a layer under the insulator 303 into a layer over the insulator 303 can be suppressed. Furthermore, oxygen contained in the insulator 402 or the like can be prevented from being diffused to lower layers.

The insulator 402 is preferably formed using an insulator from which oxygen is released by heating. Specifically, it is preferable to use an insulator with the following characteristics: the amount of oxygen that is released from the insulator in thermal desorption spectroscopy (TDS) and converted into oxygen atoms is $1.0 \times 10^{18}$ atoms/cm$^3$ or more, preferably $3.0 \times 10^{20}$ atoms/cm$^3$ or more. Note that oxygen released by heating is also referred to as excess oxygen. When the insulator 402 is formed in contact with the oxide 406a, oxygen can be supplied to the oxide 406b effectively. Note that the temperature of the film surface in the TDS analysis is preferably higher than or equal to 100° C. and lower than or equal to 700° C., or higher than or equal to 100° C. and lower than or equal to 500° C.

Furthermore, the concentration of impurities such as water, hydrogen, and nitrogen oxide in the insulator 402 is preferably lowered. The amount of hydrogen released from the insulator 402 that is converted into hydrogen molecules per area of the insulator 402 is less than or equal to $2 \times 10^{15}$ molecules/cm$^2$, preferably less than or equal to $1 \times 10^{15}$ molecules/cm$^2$, further preferably less than or equal to $5 \times 10^{14}$ molecules/cm$^2$ in TDS analysis in a film-surface temperature range of 50° C. to 500° C., for example.

The insulators 302, 303, and 402 serve as a gate insulating film. In the transistor 400a, an insulating film in which the insulator 302, the insulator 303, and the insulator 402 are stacked is used as a gate insulating film. However, the semiconductor device described in this embodiment is not limited to this example, and it is also possible to use one or two of the insulator 302, the insulator 303, and the insulator 402 as the gate insulating film.

The transistor described in this embodiment preferably includes the oxides 406a, 406b, and 406c, which are described below.

The oxide 406a is preferably positioned in contact with the top surface of the insulator 402. The oxide 406b is preferably positioned in contact with the top surface of the oxide 406a.

The oxide 406b includes a first region, a second region, and a third region. In the top view, the third region is positioned between the first region and the second region. The transistor 400a described in this embodiment includes the conductor 416a1 over and in contact with the first region of the oxide 406b. In addition, the transistor 400a includes the conductor 416a2 over and in contact with the second region of the oxide 406b. One of the first and second regions of the oxide 406b can function as a source region, and the other can function as a drain region. The third region of the oxide 406b can function as a channel formation region.

The oxide 406c is preferably formed over the oxides 406a and 406b and the conductors 416a1 and 416a2 to be in contact with the third region of the oxide 406b. The oxide 406c may cover side surfaces of the oxide 406a and the oxide 406b. As illustrated in FIG. 8C, the side surfaces of the oxides 406a and 406b in the channel width direction are preferably in contact with the oxide 406c. In addition, the conductor 404 functioning as the other gate electrode is provided to cover the third region of the oxide 406b entirely with the insulator 412 functioning as a gate insulating film provided therebetween.

The oxide 406c may be provided to cover the oxide 406a and the oxide 406b entirely. For example, side surfaces of the oxides 406a and 406b in the channel length direction may be in contact with the oxide 406c.

Note that the oxide used for the transistor has the above-described three-layer structure in this embodiment; however, one embodiment of the present invention is not limited thereto. For example, a two-layer structure without the oxide 406a or the oxide 406c may be employed. Alternatively, a four-layer structure in which any one of semiconductors, which are described below, is provided under or over the oxide 406a or under or over the oxide 406c may be employed. Alternatively, an n-layer structure (n is an integer of 5 or more) may be employed in which any one of the semiconductors described in this embodiment as examples of the oxides 406a, 406b, and 406c is provided in two or more of the following positions: over the oxide 406a, under the oxide 406a, over the oxide 406c, and under the oxide 406c.

The conductors 416a1 and 416a2 are preferably provided to be separate from each other and in contact with the top surface of the oxide 406b. Here, the conductor 416a1 can function as one of source and drain electrodes, and the conductor 416a2 can function as the other.

As illustrated in FIGS. 8A and 8B, one side end portion of the conductor 416a1 is preferably substantially aligned with one side end portion of the oxide 406a and one side end portion of the oxide 406b. Similarly, one side end portion of the conductor 416a2 is preferably substantially aligned with the other side end portion of the oxide 406a and the other side end portion of the oxide 406b. With such a structure, the side surfaces of the oxides 406a and 406b are not in contact with the conductors 416a1 and 416a2. This can prevent formation of oxygen vacancies in the side surfaces of the oxides 406a and 406b due to extraction of oxygen from the side surfaces of the oxides 406a and 406b to the conductors 416a1 and 416a2. In addition, the impurities due to the conductors 416a1 and 416a2 can be prevented from entering from the side surfaces of the oxides 406a and 406b.

Here, the distance between the side end portion of the conductor 416a1 and the side end portion of the conductor 416a2 that face each other, that is, the channel length of the transistor is greater than or equal to 10 nm and less than or equal to 300 nm, typically, greater than or equal to 20 nm and less than or equal to 180 nm.

The angle formed between the side surface and the bottom surface of the conductor 416a1 and the angle formed between the side surface and the bottom surface of the conductor 416a2 are each preferably less than 90°, which is a taper angle. Each of the angles is further preferably greater than or equal to 45° and less than or equal to 75° or less. Here, the side surface of the conductor 416a1 faces the side surface of the conductor 416a2. When the conductors 416a1 and 416a2 are formed to have such a structure, the oxide 406c can be formed with good coverage also in step portions formed by the conductors 416a1 and 416a2. Accordingly, for example, disconnection or the like of the oxide 406c, which causes the oxide 406b to be in contact with the insulator 412, can be prevented.

A barrier film 417a1 is preferably provided in contact with the top surface of the conductor 416a1, and a barrier film 417a2 is preferably provided in contact with the top surface of the conductor 416a2. The barrier films 417a1 and 417a2 each have a function of inhibiting the passage of impurities such as water and hydrogen. Aluminum oxide or the like can be used for the barrier films 417a1 and 417a2, for example. The barrier films 417a1 and 417a2 can prevent surrounding excess oxygen from being used for oxidation of the conductors 416a1 and 416a2. In addition, an increase in electric resistance value of the conductors 416a1 and 416a2 due to oxidation of the conductors 416a1 and 416a2 can be prevented. Note that the electric resistance values of the conductors can be measured by a two-terminal method or the like.

Moreover, since the barrier film 417a1 as well as the insulator 412 and the oxide 406c is positioned between the conductor 404 and the conductor 416a1, the parasitic capacitance between the conductor 404 and the conductor 416a1 can be small. Similarly, since the barrier film 417a2 as well as the insulator 412 and the oxide 406c is positioned between the conductor 404 and the conductor 416a2, the parasitic capacitance between the conductor 404 and the conductor 416a2 can be small. Thus, the transistor described in this embodiment has excellent frequency characteristics. Note that the barrier films 417a1 and 417a2 are not necessarily formed.

The insulator 412 can function as a gate insulating film and is preferably in contact with the top surface of the oxide 406c. Like the insulator 402, the insulator 412 is preferably formed using an insulator from which oxygen is released by heating. When the insulator 412 formed using the insulator is formed in contact with the top surface of the oxide 406c, oxygen can be supplied to the oxide 406b effectively. Furthermore, the concentration of impurities such as water and hydrogen in the insulator 412 is preferably lowered as in the insulator 402.

The conductor 404 preferably has a stack of the conductor 404a, the conductor 404b, and the conductor 404c. The conductor 404a is provided over the insulator 412, the conductor 404b is provided over the conductor 404a, and the conductor 404c is provided over the conductor 404b. The insulator 412 and the conductor 404 include regions overlapping with the oxide 406b. Side surfaces of the conductors 404a to 404c are substantially aligned. Here, the conductor 404 functions as the other gate electrode. The width of the conductor 404 functioning as the other gate electrode in the channel length direction is greater than or equal to 10 nm and less than or equal to 300 nm, preferably greater than or equal to 20 nm and less than or equal to 180 nm.

One of the conductors 310 and 404 can function as a gate electrode, and the other can function as a back gate electrode. The gate electrode and the back gate electrode are provided with the channel formation region in the semiconductor positioned therebetween. The potential of the back gate electrode may be the same as that of the gate electrode or may be a ground potential or a predetermined potential. By changing a potential of the back gate electrode independently of the potential of the gate electrode, the threshold voltage of the transistor can be changed.

The conductor 404a is preferably a metal oxide having conductivity. For example, the metal oxide that can be used as the oxide 406a, 406b, or 406c can be used. In particular, of In—Ga—Zn oxides, a metal oxide with an atomic ratio of In:Ga:Zn=4:2:3 to 4:2:4.1 or in the neighborhood thereof, which has high conductivity, is preferably used. When the conductor 404a is provided, the passage of oxygen to the conductors 404b and 404c can be inhibited. Thus, an increase in electric resistance value of the conductors 404b and 404c due to oxidation of the conductors 404b and 404c can be prevented. Moreover, excess oxygen can be supplied to the oxide 406b.

The conductor 404b is preferably a conductor that can add impurities such as nitrogen to the conductor 404a to improve the conductivity of the conductor 404a. For example, titanium nitride or the like is preferably used for the conductor 404b.

The conductor 404c can be formed using a metal with low resistance such as tungsten, for example.

Here, the conductor 404 functioning as a gate electrode is provided to cover the top surface of the third region and its periphery and the side surface, which is in the channel width direction, of the oxide 406b with the insulator 412 and the oxide 406c provided therebetween. Thus, the electric field of the conductor 404 functioning as a gate electrode can electrically surround the top surface of the third region and its periphery and the side surface, which is in the channel width direction, of the oxide 406b. The structure of the transistor in which the channel formation region is electrically surrounded by the electric field of the conductor 404 is referred to as a surrounded channel (s-channel) structure. Thus, a channel can be formed in the top surface of the third region and its periphery and the side surface, which is in the channel width direction, of the oxide 406b; therefore, a large amount of current can flow between the source and the drain, and a current in an on state (on-state current) can be increased. Moreover, since the top surface of the third region and its periphery and the side surface, which is in the channel width direction, of the oxide 406b are surrounded by the electric field of the conductor 404, a current in an off state (off-state current) can be reduced.

A barrier film 418 is preferably provided over the conductor 404. Here, for the barrier film 418, a material that is relatively impermeable to oxygen is preferably used, and aluminum oxide or the like can be used. Accordingly, surrounding excess oxygen can be prevented from being used for oxidation of the conductor 404. Thus, the barrier film 418 functions as a gate cap for protecting a gate. Note that the barrier film 418 is not necessarily formed.

<Structure Example of Capacitor>

Structure examples of a capacitor provided in a semiconductor device in this embodiment are described with reference to FIGS. 9A to 9D.

Figure 9A:
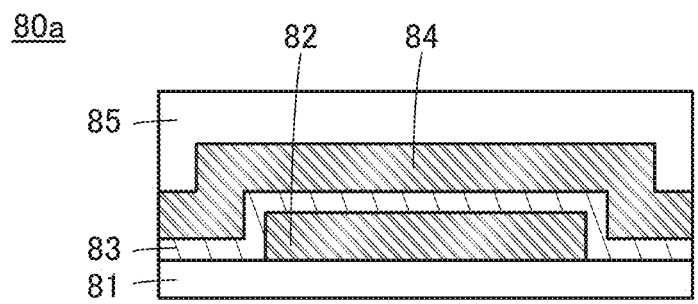
FIGS. 9A to 9D are cross-sectional views illustrating a capacitor used in a semiconductor device of one embodiment of the present invention.

FIG. 9A is a cross-sectional view of a capacitor 80a included in the semiconductor device in this embodiment. The capacitor 80a includes a conductor 82, an insulator 83, and a conductor 84. As illustrated in FIG. 9A, the conductor 82 is provided over an insulator 81, the insulator 83 is provided to cover the conductor 82, the conductor 84 is provided to cover the insulator 83, and an insulator 85 is provided over the conductor 84.

Here, it is preferable that the insulator 83 be in contact with a side surface of the conductor 82, and that the conductor 84 be in contact with a side surface of a projecting portion of the insulator 83. Accordingly, not only the top surface of the conductor 82 but also the side surface of the conductor 82 can function as a capacitor, resulting in an increased capacitance value.

The conductor 82 functions as one electrode of the capacitor 80a, the conductor 84 functions as the other electrode of the capacitor 80a, and the insulator 83 functions as a dielectric of the capacitor 80a.

The conductor 82 and the conductor 84 may each be formed to have a single-layer structure or a stacked-layer structure including a conductor containing, for example, one or more kinds of boron, nitrogen, oxygen, fluorine, silicon, phosphorus, aluminum, titanium, chromium, manganese, cobalt, nickel, copper, zinc, gallium, yttrium, zirconium, molybdenum, ruthenium, silver, indium, tin, tantalum, and tungsten. An alloy or a compound containing the above element may be used, for example, and a conductor containing aluminum, a conductor containing copper and titanium, a conductor containing copper and manganese, a conductor containing indium, tin, and oxygen, a conductor containing titanium and nitrogen, or the like may be used. The conductor 82 and the conductor 84 can be formed by a sputtering method, a CVD method, an MBE method, a PLD method, an ALD method, or the like.

As the insulator 83, an insulator containing one or more of aluminum oxide, aluminum oxynitride, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, tantalum oxide, and the like can be used, for example. It is particularly preferable to use a high-k material such as hafnium silicate (HfSi$_x$O$_y$ (x>0, y>0)), hafnium silicate to which nitrogen is added (HfSi$_x$O$_y$N$_z$ (x>0, y>0, z>0)), hafnium aluminate to which nitrogen is added (HfAl$_x$O$_y$N$_z$ (x>0, y>0, z>0)), hafnium oxide, or yttrium oxide. In the case where a high-k material is used for the insulator 83, the capacitance can be increased by heat treatment in some cases. The use of such a high-k material enables sufficient capacitance of the capacitor 80a to be ensured even if the insulator 83 has a large thickness. The insulator 83 having a large thickness can reduce leakage current generated between the conductor 82 and the conductor 84. The insulator 83 can be formed by a sputtering method, a CVD method, an MBE method, a PLD method, an ALD method, or the like.

The insulator 81 and the insulator 85 may each be formed to have, for example, a single-layer structure or a stacked-layer structure including an insulator containing boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For the insulator 81 and the insulator 85, aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide is used. The insulator 81 and the insulator 85 can be formed by a sputtering method, a CVD method, an MBE method, a PLD method, an ALD method, or the like. The insulator 85 may be formed using an organosilane gas (e.g., tetra-ethyl-ortho-silicate (TEOS)).

Figure 9B:
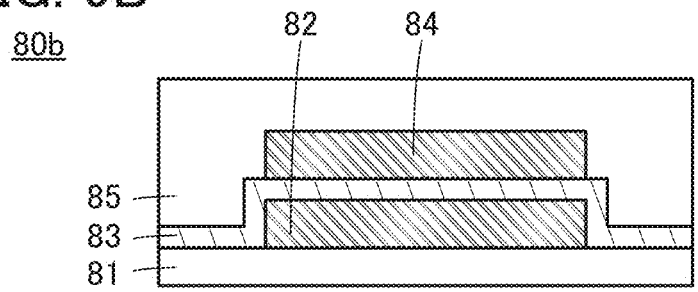

A capacitor 80b illustrated in FIG. 9B is different from the capacitor 80a illustrated in FIG. 9A in that the conductor 84 overlaps the top surface of the conductor 82. Note that although the side surface of the conductor 84 is substantially aligned with the side surface of the conductor 82 in FIG. 9B, the capacitor 80b is not limited thereto.

Figure 9C:
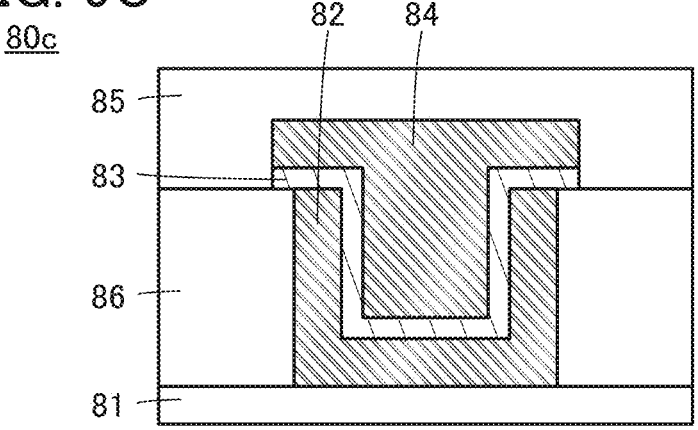

A capacitor 80c illustrated in FIG. 9C is different from the capacitor 80a illustrated in FIG. 9A in that an insulator 86 with an opening is provided over the insulator 81, and that the conductor 82 is provided in the opening. Here, a space formed by the opening in the insulator 86 and the top surface of the insulator 81 can be regarded as a groove portion, and the conductor 82 is preferably provided along the groove portion. Furthermore, as illustrated in FIG. 9C, the insulator 86 and the conductor 82 may be formed so that their top surfaces are substantially aligned with each other.

The insulator 83 is provided over the conductor 82, and the conductor 84 is provided over the insulator 83. Here, in the groove portion, the conductor 84 has a region which overlaps the conductor 82 with the insulator 83 provided therebetween. In addition, the insulator 83 is preferably provided to cover the top surface of the conductor 82. When the insulator 83 is provided as described above, leakage current can be prevented from flowing between the conductor 82 and the conductor 84. In addition, the side surface of the insulator 83 may be substantially aligned with the side surface of the conductor 84. In this manner, the capacitor 80c preferably has a concave shape, a cylinder shape, or the like. Note that in the capacitor 80c, the shapes of the top surfaces of the conductor 82, the insulator 83, and the conductor 84 may each be a polygonal shape other than the quadrangular shape or a circular shape including an elliptical shape.

Figure 9D:
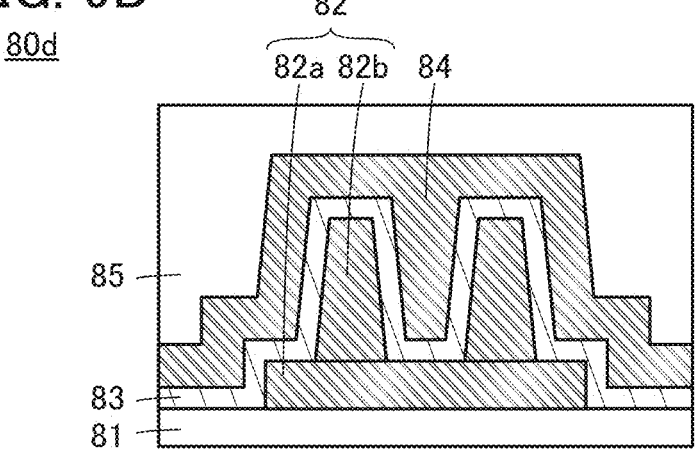

A capacitor 80d illustrated in FIG. 9D is different from the capacitor 80a illustrated in FIG. 9A in that a projecting conductor 82*b* is in contact with the top surface of a conductor 82*a*. The capacitor 80*d* is provided over the insulator 81 and includes the conductor 82 (the conductor 82*a* and the conductor 82*b*), the insulator 83, and the conductor 84.

Note that when the conductor 82, which functions as one electrode of the capacitor 80*d*, includes a projecting structure body like the conductor 82*b*, the capacitance of the capacitor per projected area can be increased. Thus, the semiconductor device can be reduced in area, highly integrated, and miniaturized.

<Substrate>

As the substrate 210, for example, an insulator substrate, a semiconductor substrate, or a conductor substrate is used. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate of silicon, germanium, or the like, or a compound semiconductor substrate of silicon carbide, silicon germanium, gallium arsenide, indium phosphide, zinc oxide, or gallium oxide can be used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Further alternatively, a flexible substrate may be used as the substrate 210. As a method for providing a transistor over a flexible substrate, there is a method in which the transistor is formed over a non-flexible substrate and then the transistor is separated and transferred to the substrate 210 which is a flexible substrate. In that case, a separation layer is preferably provided between the non-flexible substrate and the transistor. As the substrate 210, a sheet, a film, or a foil containing a fiber may be used, for example. The substrate 210 may have elasticity. The substrate 210 may have a property of returning to its original shape when bending or pulling is stopped. Alternatively, the substrate 210 may have a property of not returning to its original shape. The substrate 210 has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate 210 has a small thickness, the weight of the semiconductor device including the transistor can be reduced. When the substrate 210 has a small thickness, even in the case of using glass or the like, the substrate 210 may have elasticity or a property of returning to its original shape when bending or pulling is stopped. Therefore, an impact applied to the semiconductor device over the substrate 210, which is caused by dropping or the like, can be reduced. That is, a durable semiconductor device can be provided.

For the flexible substrate 210, a metal, an alloy, a resin, glass, or fiber thereof can be used, for example. The flexible substrate 210 preferably has a lower coefficient of linear expansion because deformation due to an environment is suppressed. The flexible substrate 210 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 210 because of its low coefficient of linear expansion.

<Insulator>

Examples of an insulator include an insulating oxide, an insulating nitride, an insulating oxynitride, an insulating nitride oxide, an insulating metal oxide, an insulating metal oxynitride, and an insulating metal nitride oxide.

The transistor is surrounded by an insulator that has a function of inhibiting passage of oxygen and impurities such as hydrogen, whereby stable electrical characteristics of the transistor can be obtained. For example, the insulator having a function of inhibiting passage of oxygen and impurities such as hydrogen is used as the insulator 401. Furthermore, the insulator having a function of inhibiting passage of oxygen and impurities such as hydrogen may be used as the insulator 303. The insulators 401 and 303 are each preferably formed using an insulating material that is relatively impermeable to impurities such as water and hydrogen than the insulator 402 and the like.

The insulator having a function of inhibiting passage of oxygen and impurities such as hydrogen may have a single-layer structure or a stacked-layer structure including, for example, a metal oxide such as aluminum oxide, aluminum oxynitride, magnesium oxide, gallium oxide, germanium oxide, yttrium oxide, zirconium oxide, lanthanum oxide, neodymium oxide, hafnium oxide, or tantalum oxide, silicon nitride oxide, silicon nitride, aluminum nitride, or the like.

When the insulator 401 includes aluminum oxide, entry of impurities such as hydrogen into the oxides 406*a*, 406*b*, and 406*c* can be suppressed. Furthermore, for example, when the insulator 401, includes aluminum oxide, outward diffusion of the above-described excess oxygen added to the oxides 406*a* to 406*c* can be suppressed.

The insulators 301, 302, 402, and 412 are each formed to have, for example, a single-layer structure or a stacked-layer structure including an insulator containing boron, carbon, nitrogen, oxygen, fluorine, magnesium, aluminum, silicon, phosphorus, argon, gallium, germanium, yttrium, zirconium, lanthanum, neodymium, hafnium, or tantalum. For example, the insulators 301, 302, 402, and 412 preferably contain silicon oxide or silicon oxynitride.

Since the insulators 302, 303, 402, and 412 function as gate insulating films, each of the insulators 302, 303, 402, and 412 preferably includes an insulator with a high relative dielectric constant. For example, it is preferable that the insulators 302, 303, 402, and 412 contain gallium oxide, hafnium oxide, an oxide containing aluminum and hafnium, an oxynitride containing aluminum and hafnium, an oxide containing silicon and hafnium, an oxynitride containing silicon and hafnium, or the like. Alternatively, the insulators 302, 303, 402, and 412 each preferably have a layered structure of silicon oxide or silicon oxynitride and an insulator with a high relative dielectric constant. Because silicon oxide and silicon oxynitride have thermal stability, combination of silicon oxide or silicon oxynitride with an insulator with a high relative dielectric constant allows the stacked-layer structure to be thermally stable and have a high relative dielectric constant. For example, when aluminum oxide, gallium oxide, or hafnium oxide is positioned on the oxide 406*c* side, entry of silicon included in the silicon oxide or the silicon oxynitride into the oxide 406b can be inhibited. When silicon oxide or silicon oxynitride is positioned on the oxide 406c side, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

The insulator 410 preferably includes an insulator with a low relative dielectric constant. For example, the insulator 410 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 410 preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with resin, the stacked-layer structure can have thermal stability and a low relative dielectric constant. Examples of the resin include polyester, polyolefin, polyamide (e.g., nylon or aramid), polyimide, polycarbonate, and acrylic.

For the barrier film 417 (the barrier films 417a1 and 417a2), an insulator having a function of inhibiting passage of oxygen and impurities such as hydrogen may be used. The barrier films 417a1 and 417a2 can prevent excess oxygen in the oxide 406c and the insulator 412 from being diffused to the conductors 416a1 and 416a2.

The barrier film 417 is formed using, for example, a metal oxide such as aluminum oxide, magnesium oxide, gallium oxide, germanium oxide, yttrium oxide, zirconium oxide, lanthanum oxide, neodymium oxide, hafnium oxide, or tantalum oxide, silicon nitride oxide, or silicon nitride.

<Conductor>

For the conductors 404, 310, 416a1, and 416a2, a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, and the like can be used. Alternatively, a semiconductor having a high electric conductivity typified by polycrystalline silicon including an impurity element such as phosphorus, or silicide such as nickel silicide may be used.

Alternatively, a conductive material containing oxygen and a metal element included in a metal oxide that can be used for the oxide 406 (the oxides 406a, 406b, and 406c) may be used. A conductive material containing the above metal element and nitrogen may be used. For example, a conductive material containing nitrogen, such as titanium nitride or tantalum nitride, may be used. Indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With any of such materials, hydrogen included in the oxides 406a, 406b, and 406c can be captured in some cases. Alternatively, hydrogen entering from an external insulator or the like can be captured in some cases.

A stack of a plurality of conductive layers formed using the above materials may be used. For example, a stacked-layer structure formed using a combination of a material including any of the metal elements listed above and a conductive material including oxygen may be used. Alternatively, a stacked-layer structure formed using a combination of a material including any of the metal elements listed above and a conductive material including nitrogen may be used. Alternatively, a stacked-layer structure formed using a combination of a material including any of the metal elements listed above, a conductive material including oxygen, and a conductive material including nitrogen may be used.

When an oxide semiconductor is used for the channel formation region of the transistor, a stacked-layer structure formed using a combination of a material containing the above-described metal element and a conductive material containing oxygen is preferably used for the gate electrode. In this case, the conductive material containing oxygen is preferably provided on the channel formation region side. The conductive material containing oxygen is provided on the channel formation region side, whereby oxygen released from the conductive material is easily supplied to the channel formation region.

For example, for the conductor 310b, a conductive material such as tungsten or polysilicon is used. The conductor 310a in contact with the insulator 401 can have a single-layer structure or a stacked-layer structure including, for example, a barrier layer (a diffusion prevention layer) formed using titanium, titanium nitride, tantalum nitride, or the like.

When an insulating material that is relatively impermeable to impurities is used for the insulator 401, and a conductive material that is relatively impermeable to impurities is used for the conductor 310a in contact with the insulator 401, diffusion of impurities to the transistor can be further suppressed. Thus, the reliability of the transistor can be further increased.

For the barrier films 417a1, 417a2, and 418, the conductive material that is relatively impermeable to impurities may be used. When a conductive material is used for the barrier films 417a1, 417a2, and 418, a conductive material from which oxygen is less likely to be released or on which oxygen is less likely to be absorbed is preferably used.

<Metal Oxide>

The oxide 406 is preferably formed using a metal oxide functioning as an oxide semiconductor (hereinafter, the metal oxide is also referred to as an oxide semiconductor). A metal oxide that can be used as the oxide 406 of the present invention is described below.

An oxide semiconductor preferably contains at least indium or zinc. It is particularly preferable that indium and zinc be contained. In addition, aluminum, gallium, yttrium, tin, or the like is preferably contained. Furthermore, one or more kinds of elements selected from boron, silicon, titanium, iron, nickel, germanium, zirconium, molybdenum, lanthanum, cerium, neodymium, hafnium, tantalum, tungsten, magnesium, and the like may be contained.

Here, the case where the oxide semiconductor is an In-M-Zn oxide containing indium, an element M, and zinc is considered. The element M is aluminum, gallium, yttrium, tin, or the like. Other elements that can be used as the element M include boron, silicon, titanium, iron, nickel, germanium, zirconium, molybdenum, lanthanum, cerium, neodymium, hafnium, tantalum, tungsten, and magnesium. Note that two or more of the above elements may be used in combination as the element M.

Note that in this specification and the like, a metal oxide containing nitrogen is also called a metal oxide in some cases. Moreover, a metal oxide containing nitrogen may be called a metal oxynitride.

[Composition of Metal Oxide]

Described below is the composition of a cloud-aligned composite oxide semiconductor (CAC-OS) that can be used in a transistor disclosed in one embodiment of the present invention.

In this specification and the like, "c-axis aligned crystal (CAAC)" or "cloud-aligned composite (CAC)" might be stated. CAAC refers to an example of a crystal structure, and CAC refers to an example of a function or a material composition.

A CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in an active layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC-metal oxide, separation of the functions can maximize each function.

The CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or CAC metal oxide is used in a channel formation region of a transistor, high current drive capability in the on state of the transistor, that is, a high on-state current and high field-effect mobility, can be obtained.

In other words, the CAC-OS or the CAC-metal oxide can be called a matrix composite or a metal matrix composite.

[Structure of Metal Oxide]

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

The CAAC-OS has c-axis alignment, its nanocrystals are connected in the a-b plane direction, and its crystal structure has distortion. Note that the distortion is a portion where the direction of a lattice arrangement changes between a region with a regular lattice arrangement and another region with a regular lattice arrangement in a region in which nanocrystals are connected.

The shape of the nanocrystal is basically hexagon. However, the shape is not always a regular hexagon and is a non-regular hexagon in some cases. A pentagonal lattice arrangement, a heptagonal lattice arrangement, and the like are included in the distortion in some cases. Note that a clear crystal grain boundary cannot be observed even in the vicinity of distortion in the CAAC-OS. That is, formation of a grain boundary is inhibited due to the distortion of lattice arrangement. This is probably because the CAAC-OS can tolerate distortion owing to a low density of arrangement of oxygen atoms in the a-b plane direction, an interatomic bond distance changed by substitution of a metal element, and the like.

The CAAC-OS tends to have a layered crystal structure (also referred to as a stacked-layer structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the elements M of the (M,Zn) layer are partly replaced with indium, the layer can also be referred to as an (In,M,Zn) layer. Also, when indium in the In layer is partly replaced with the element M, the layer can be referred to as an (In,M) layer.

The CAAC-OS is an oxide semiconductor with high crystallinity. In contrast, in the CAAC-OS, a reduction in electron mobility due to the grain boundary is less likely to occur because a clear grain boundary cannot be observed. Entry of impurities, formation of defects, or the like might decrease the crystallinity of an oxide semiconductor. This means that the CAAC-OS has small amounts of impurities and defects (e.g., oxygen vacancies). Thus, an oxide semiconductor including a CAAC-OS is physically stable. Therefore, the oxide semiconductor including a CAAC-OS is resistant to heat and has high reliability.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, the nc-OS cannot be distinguished from an a-like OS or an amorphous oxide semiconductor, depending on an analysis method.

An a-like OS has a structure between those of the nc-OS and the amorphous oxide semiconductor. The a-like OS has a void or a low-density region. That is, the a-like OS has low crystallinity as compared with the nc-OS and the CAAC-OS.

An oxide semiconductor can have various structures which show various different properties. Two or more of the amorphous oxide semiconductor, the polycrystalline oxide semiconductor, the a-like OS, the nc-OS, and the CAAC-OS may be included in an oxide semiconductor of one embodiment of the present invention.

[Transistor Including Oxide Semiconductor]

Next, the case where the oxide semiconductor is used for a transistor is described.

Note that when the oxide semiconductor is used for a transistor, the transistor can have high field-effect mobility. In addition, the transistor can have high reliability.

An oxide semiconductor with low carrier density is preferably used for the transistor. In order to reduce the carrier density of the oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. For example, an oxide semiconductor whose carrier density is lower than $8\times10^{11}/cm^3$, preferably lower than $1\times10^{11}/cm^3$, further preferably lower than $1\times10^{10}/cm^3$, and higher than or equal to $1\times10^{-9}/cm^3$ is used.

A highly purified intrinsic or substantially highly purified intrinsic oxide semiconductor film has a low density of defect states and accordingly has a low density of trap states in some cases.

Charges trapped by the trap states in the oxide semiconductor take a long time to be released and may behave like fixed charges. Thus, a transistor whose channel formation region is formed in an oxide semiconductor having a high density of trap states has unstable electrical characteristics in some cases.

To obtain stable electrical characteristics of the transistor, it is effective to reduce the concentration of impurities in the oxide semiconductor. In order to reduce the concentration of impurities in the oxide semiconductor, the concentration of impurities in a film which is adjacent to the oxide semiconductor is preferably reduced. As examples of the impurities, hydrogen, nitrogen, alkali metal, alkaline earth metal, iron, nickel, silicon, and the like are given.

[Impurity]

Here, the influence of impurities in the oxide semiconductor is described.

When silicon or carbon that is one of Group 14 elements is contained in the oxide semiconductor, defect states are formed. Thus, the concentration of silicon or carbon in the oxide semiconductor and around an interface with the oxide semiconductor (measured by secondary ion mass spectrometry (SIMS)) is set lower than or equal to $2\times10^{18}$ atoms/cm$^3$, and preferably lower than or equal to $2\times10^{17}$ atoms/cm$^3$.

When the oxide semiconductor contains alkali metal or alkaline earth metal, defect states are formed and carriers are generated in some cases. Thus, a transistor including an oxide semiconductor that contains alkali metal or alkaline earth metal is likely to be normally on. Therefore, it is preferable to reduce the concentration of alkali metal or alkaline earth metal of the oxide semiconductor. Specifically, the concentration of alkali metal or alkaline earth metal in the oxide semiconductor measured by SIMS is set lower than or equal to $1\times10^{18}$ atoms/cm$^3$, and preferably lower than or equal to $2\times10^{16}$ atoms/cm$^3$.

When the oxide semiconductor contains nitrogen, the oxide semiconductor easily becomes n-type by generation of electrons serving as carriers and an increase of carrier density. Thus, a transistor whose semiconductor includes an oxide semiconductor that contains nitrogen is likely to be normally on. For this reason, nitrogen in the oxide semiconductor is preferably reduced as much as possible; the nitrogen concentration measured by SIMS is set, for example, lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, and still further preferably lower than or equal to $5\times10^{17}$ atoms/cm$^3$.

Hydrogen contained in an oxide semiconductor reacts with oxygen bonded to a metal atom to be water, and thus causes an oxygen vacancy, in some cases. Entry of hydrogen into the oxygen vacancy generates an electron serving as a carrier in some cases. Furthermore, in some cases, bonding of part of hydrogen to oxygen bonded to a metal atom causes generation of an electron serving as a carrier. Thus, a transistor including an oxide semiconductor which contains hydrogen is likely to be normally on. Accordingly, it is preferable that hydrogen in the oxide semiconductor be reduced as much as possible. Specifically, the hydrogen concentration measured by SIMS is set lower than $1\times10^{20}$ atoms/cm$^3$, preferably lower than $1\times10^{19}$ atoms/cm$^3$, further preferably lower than $5\times10^{18}$ atoms/cm$^3$, and still further preferably lower than $1\times10^{18}$ atoms/cm$^3$.

When an oxide semiconductor with sufficiently reduced impurity concentration is used for a channel formation region in a transistor, the transistor can have stable electrical characteristics.

<Modification Example of Transistor>

The structure of the transistor in this embodiment is not limited to the structure in FIGS. 8A to 8C. A modification example of the transistor in this embodiment is described below with reference to FIGS. 10A to 10C. For the components that are denoted by the same reference numerals as those of the transistor 400*a* in the following description, the corresponding description of the transistor 400*a* can be referred to.

Figure 10A:
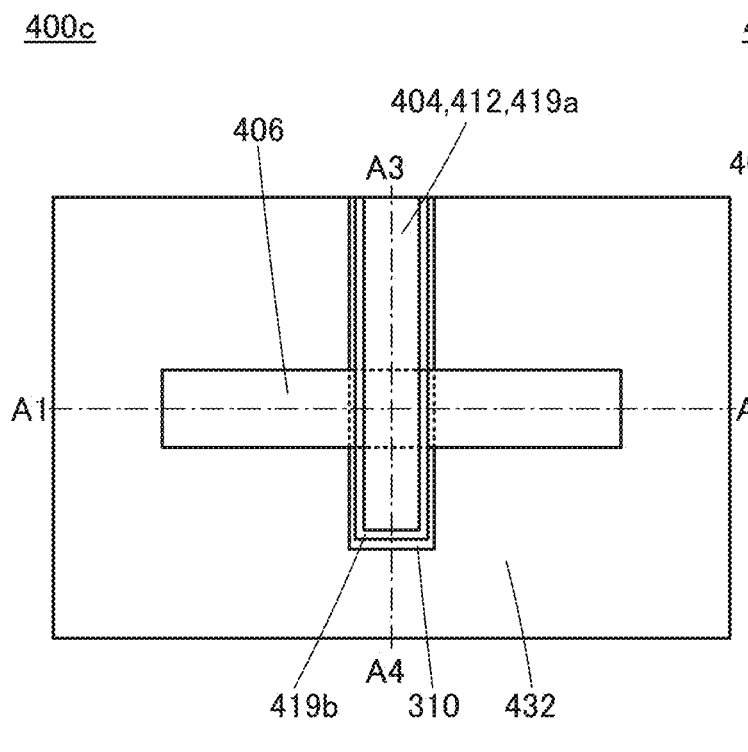
FIGS. 10A to 10C illustrate a transistor used in a semiconductor device of one embodiment of the present invention.
Figure 10C:
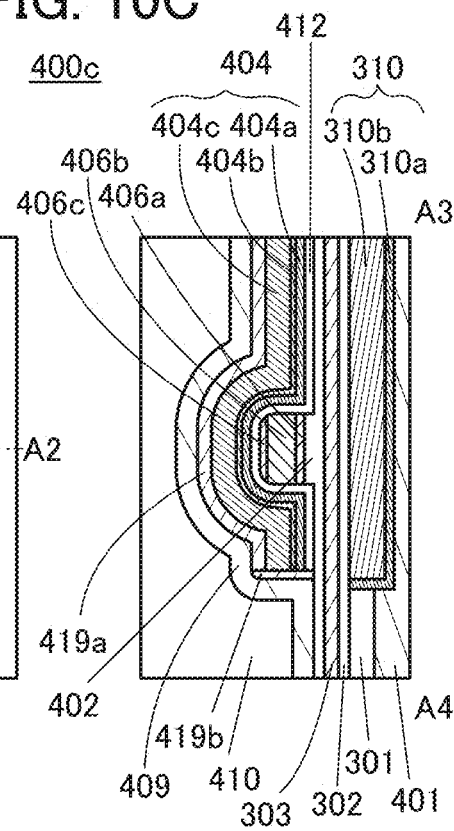
Figure 10B:
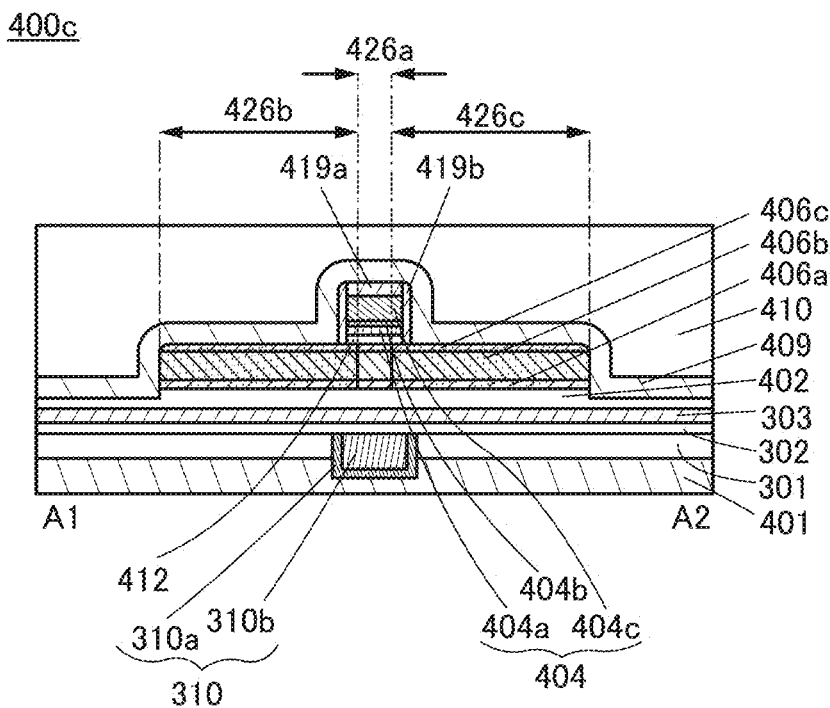

A transistor 400*c* illustrated in FIGS. 10A to 10C is described. The transistor 400*c* includes the insulator 401 and the insulator 301 over a substrate (not illustrated); the conductor 310 embedded in the insulator 301; the insulator 302 over the insulator 301 and the conductor 310; the insulator 303 over the insulator 302; the insulator 402 over the insulator 303; the oxide 406*a* over the insulator 402; the oxide 406*b* in contact with at least part of the top surface of the oxide 406*a*; the oxide 406*c* over the oxide 406*b*; the insulator 412 over the oxide 406*c*; the conductor 404 over the insulator 412; an insulator 419*a* over the conductor 404; an insulator 419*b* in contact with side surfaces of the insulator 412, the conductor 404, and the insulator 419*a*; and an insulator 409 in contact with the top surface of the oxide 406*c* and a side surface of the insulator 419*b*. Here, as illustrated in FIG. 10B, a top surface of the insulator 419*b* is preferably substantially aligned with a top surface of the insulator 419*a*. Furthermore, the insulator 409 is preferably provided to cover the insulator 419*a*, the insulator 402, the insulator 419*b*, the oxide 406*a*, the oxide 406*b*, and the oxide 406*c*.

The transistor 400*c* is different from the transistor 400*a* in that the conductor 416*a*1 and the conductor 416*a*2 are not provided, that the insulators 409, 419*a*, and 419*b* are provided, and that the regions 426*a*, 426*b*, and 426*c* are formed in the oxides 406*a*, 406*b*, and 406*c*.

As illustrated in FIG. 10B, the region 426*a* is sandwiched between the region 426*b* and the region 426*c*. The regions 426*b* and 426*c* are reduced in resistance through formation of the insulator 409, and have higher conductivity than the region 426*a*. Thus, the regions 426*b* and 426*c* may each be regarded as a conductor in this specification. An impurity element such as hydrogen or nitrogen included in the atmosphere for forming the insulator 409 is added to the region 426*b* and the region 426*c*. Accordingly, oxygen vacancies are formed because of the added impurity elements, and the impurity elements enter the oxygen vacancies, thereby increasing the carrier density and reducing resistance mainly in a region of the oxide 406 that is in contact with the insulator 409.

Thus, it is preferable that the concentration of at least one of hydrogen and nitrogen be higher in the regions 426b and 426c than in the region 426a. The concentration of hydrogen or nitrogen is measured by SIMS or the like.

The regions 426b and 426c are reduced in resistance when an element forming an oxygen vacancy or an element trapped by an oxygen vacancy is added thereto. Typical examples of the element are hydrogen, boron, carbon, nitrogen, fluorine, phosphorus, sulfur, chlorine, titanium, and a rare gas. Typical examples of the rare gas element include helium, neon, argon, krypton, and xenon. Accordingly, the regions 426b and 426c are made to include one or more of the above elements.

As illustrated in FIG. 10B, the region 426b and the region 426c are formed in the oxides 406a, 406b, and 406c in at least regions that overlap with the insulator 409. The region 426b of the oxide 406b can serve as one of a source region and a drain region, and the region 426c of the oxide 406b can serve as the other of the source region and the drain region. The region 426a of the oxide 406b can serve as a channel formation region.

In the transistor 400c, the regions 426b and 426c are preferably formed in the oxide 406 in regions that are in contact with the insulator 409 and regions that overlap with the vicinity of edges of the insulators 419b and 412, as illustrated in FIG. 10B. In that case, portions of the regions 426b and 426c that overlap with the conductor 404 serve as what we call overlap regions (also referred to as Lov regions). With the Lov regions, no high-resistance region is formed between the channel formation region and the source or drain region of the oxide 406; accordingly, the on-state current and mobility of the transistor can be increased.

In addition, it is preferable that the positions of side surfaces of the insulator 419a be substantially the same as the positions of side surfaces of the insulator 412 and the conductor 404 when the substrate is perpendicularly seen from above. The insulator 419a is preferably formed by an ALD method. In that case, the insulator 419a can be formed with a thickness of approximately 1 nm to 20 nm inclusive, preferably approximately 5 nm to 10 nm inclusive. The insulator 419a is preferably formed using an insulating material having a function of inhibiting the passage of oxygen and impurities such as water and hydrogen, and is preferably formed using aluminum oxide or hafnium oxide, for example.

The insulator 419b is provided in contact with the side surfaces of the insulator 412, the conductor 404, and the insulator 419a. Furthermore, the top surface of the insulator 419b is preferably substantially aligned with the top surface of the insulator 419a. The insulator 419b is preferably formed using an ALD method. Accordingly, the thickness of the insulator 419b can be approximately 1 nm to 20 nm inclusive, preferably approximately 1 nm to 3 nm inclusive (e.g., 1 nm).

Like the insulator 419a, the insulator 419b is preferably formed using an insulating material that has a function of inhibiting the passage of oxygen and impurities such as water and hydrogen, and is preferably formed using aluminum oxide or hafnium oxide, for example. In this manner, oxygen in the insulator 412 can be prevented from diffusing outward. In addition, impurities such as water and hydrogen can be prevented from entering the oxide 406 through the end portion or the like of the insulator 412.

When the insulators 419b and 419a are provided as described above, the insulators with a function of inhibiting the passage of oxygen and impurities such as water and hydrogen can cover the top and side surfaces of the conductor 404 and the side surface of the insulator 412. This can prevent entry of impurities such as water and hydrogen into the oxide 406 through the conductor 404 and the insulator 412. Thus, the insulator 419b functions as a side barrier for protecting side surfaces of a gate electrode and a gate insulating film, and the insulator 419a functions a top barrier for protecting a top surface of the gate electrode.

The insulator 419b is preferably formed in the following manner: an insulating film is deposited by an ALD method and then subjected to anisotropic etching so that a portion of the insulating film in contact with the side surfaces of the insulator 412, the conductor 404, and the insulator 419a remains. Thus, the insulator 419b having a small thickness as described above can be easily formed. At this time, even when the insulator 419a provided over the conductor 404 is partly removed by the anisotropic etching, the portion of the insulator 419b in contact with the insulator 412 and the conductor 404 can remain sufficiently.

The insulator 409 is provided to cover the insulator 419a, the insulator 419b, the oxide 406a, the oxide 406b, the oxide 406c, and the insulator 402. Here, the insulator 409 is provided in contact with the top surface of the insulator 419a and the top and side surfaces of the insulator 419b. The insulator 409 is preferably formed using an insulating material that has a function of inhibiting the passage of oxygen and impurities such as water and hydrogen. For example, the insulator 409 is preferably formed using silicon nitride, silicon nitride oxide, silicon oxynitride, aluminum nitride, or aluminum nitride oxide. When the insulator 409 is formed using any of the above materials, entry of oxygen into the regions 426b and 426c through the insulator 409 to be supplied to oxygen vacancies in the regions 426b and 426c, which decreases the carrier density, can be prevented. In addition, entry of impurities such as water and hydrogen into the regions 426b and 426c through the insulator 409, which causes the regions 426b and 426c to excessively extend to the region 426a side, can be prevented.

As illustrated in FIGS. 10A to 10C, the side surfaces of the oxide 406a, the oxide 406b, and the oxide 406c are substantially aligned with each other in the transistor 400c when the substrate is perpendicularly seen from above; however, this embodiment is not limited to this example. The oxide 406c may cover the side surfaces of the oxide 406a and the oxide 406b, for example. At this time, the side surfaces of the oxides 406a and 406b in the channel width direction are preferably in contact with the oxide 406c. Furthermore, side surfaces of the oxides 406a and 406b in the channel length direction may be in contact with the oxide 406c.

As described above, the structures, methods, and the like described in this embodiment can be combined with any of the structures, methods, and the like described in the other embodiments as appropriate.

Note that this embodiment can be combined with the other embodiments as appropriate.

Embodiment 2

In this embodiment, examples of a semiconductor device (memory device) of one embodiment of the present invention are described.

<Circuit of Semiconductor Device (Memory Device)>

Figure 11A:
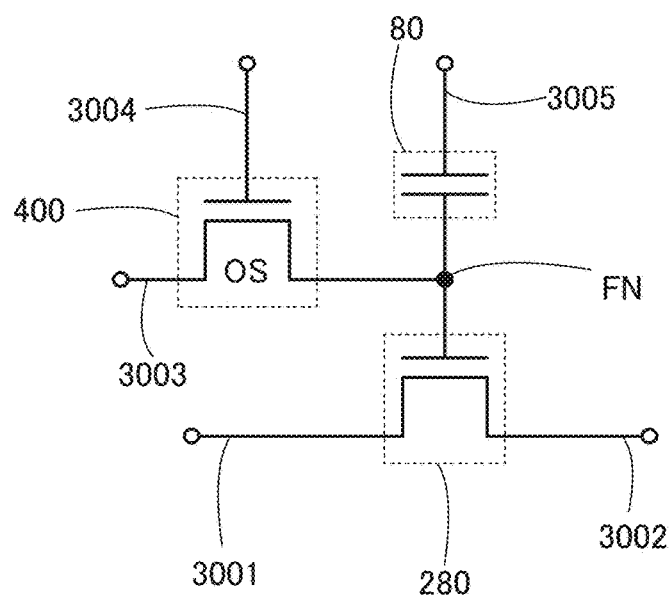
FIGS. 11A to 11C are circuit diagrams each illustrating a circuit of a semiconductor device (a memory device) of one embodiment of the present invention.
Figure 11B:
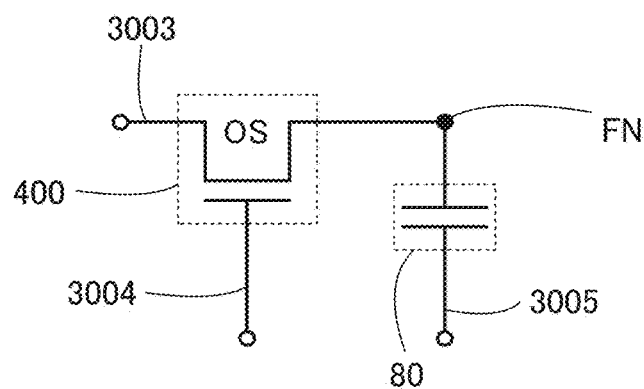
Figure 11C:
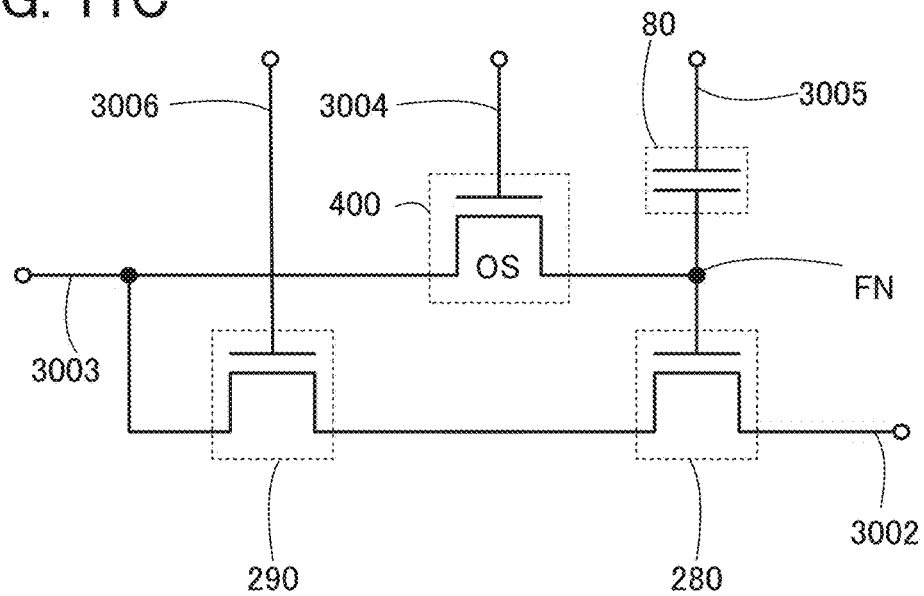

FIGS. 11A to 11C show circuit examples of the semiconductor device (memory device) of one embodiment of the present invention.

The semiconductor device illustrated in FIG. 11A includes a transistor 280 using a first semiconductor material, a transistor 400 using a second semiconductor material, and a capacitor 80.

The first and second semiconductor materials preferably have different energy gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. In contrast, a transistor including an oxide semiconductor has a low off-state current.

The transistor 400 is a transistor in which a channel is formed in a semiconductor layer containing an oxide semiconductor. When the transistor 400, which has a low off-state current, is used in a semiconductor device (memory device), stored data can be retained for a long time. In other words, it is possible to obtain a semiconductor device (memory device) which does not require refresh operation or has an extremely low frequency of the refresh operation, which leads to a sufficient reduction in power consumption.

In FIG. 11A, a first wiring 3001 is electrically connected to the source of the transistor 280. A second wiring 3002 is electrically connected to the drain of the transistor 280. A third wiring 3003 is electrically connected to one of a source and a drain of the transistor 400. A fourth wiring 3004 is electrically connected to a gate of the transistor 400. A gate of the transistor 280 and the other of the source and the drain of the transistor 400 are electrically connected to one electrode of the capacitor 80. A fifth wiring 3005 is electrically connected to the other electrode of the capacitor 80. In FIG. 11A, "FN", which denotes a floating node, is written at a connection portion of the gate of the transistor 280, the other of the source and the drain of the transistor 400, and the one electrode of the capacitor 80. When the transistor 400 is turned off, a potential supplied to the floating node (FN), the one electrode of the capacitor 80, and the gate of the transistor 280 can be held.

The semiconductor device in FIG. 11A has a feature that the potential of the gate of the transistor 280 can be retained, and thus enables writing, retaining, and reading of data as follows.

Writing and retaining of data are described. First, the potential of the fourth wiring 3004 is set to a potential at which the transistor 400 is turned on, so that the transistor 400 is turned on. Accordingly, the potential of the third wiring 3003 is supplied to the floating node where the gate of the transistor 280 and the one electrode of the capacitor 80 are electrically connected to each other. That is, a predetermined charge is supplied to the gate of the transistor 280 (writing). Here, one of two kinds of charges providing different potential levels (hereinafter referred to as a low-level charge and a high-level charge) is supplied. After that, the potential of the fourth wiring 3004 is set to a potential at which the transistor 400 is turned off, so that the transistor 400 is turned off. Thus, the charge supplied to the floating node is held (retaining).

Since the off-state current of the transistor 400 is extremely low, the charge in the floating node is held for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the floating node. This is because in general, when the transistor 280 is an n-channel transistor, an apparent threshold voltage $V_{th\_H}$ at the time when a high-level charge is given to the gate of the transistor 280 is lower than an apparent threshold voltage $V_{th\_L}$ at the time when a low-level charge is given to the gate of the transistor 280. Here, an apparent threshold voltage refers to the potential of the fifth wiring 3005 which is needed to turn on the transistor 280. Thus, the potential of the fifth wiring 3005 is set to a potential $V_0$ which is between $V_{th\_H}$ and $V_{th\_L}$, whereby charge supplied to the floating node can be determined. For example, in the case where the high-level charge is supplied to the floating node in writing and the potential of the fifth wiring 3005 becomes $V_0$ ($>V_{th\_H}$), the transistor 280 is brought into an "on state". In contrast, in the case where the low-level charge is supplied to the floating node in writing, the transistor 280 remains in an "off state" even when the potential of the fifth wiring 3005 becomes $V_0$ ($<V_{th\_L}$). Thus, the data retained in the floating node can be read by determining the potential of the second wiring 3002.

By arranging semiconductor devices each having the structure illustrated in FIG. 11A in a matrix, a memory device (memory cell array) can be formed.

Note that in the case where memory cells are arrayed, it is necessary that data of a desired memory cell is read in read operation. A configuration in which only data of a desired memory cell can be read by supplying a potential at which the transistor 280 is brought into an off state regardless of the charge supplied to the floating node, that is, a potential lower than $V_{th\_H}$ to the fifth wiring 3005 of memory cells from which data is not read is employed, for example. Alternatively, a configuration in which only data of a desired memory cell can be read by supplying a potential at which the transistor 280 is brought into an on state regardless of the charge supplied to the floating node, that is, a potential higher than $V_{th\_L}$ to the fifth wiring 3005 of memory cells from which data is not read is employed.

Although an example in which two kinds of charges are retained in the floating node, the semiconductor device of the present invention is not limited to this example. For example, a structure in which three or more kinds of charges can be retained in the floating node of the semiconductor device may be employed. With such a structure, the semiconductor device can be multi-valued and the storage capacity can be increased.

A semiconductor device illustrated in FIG. 11B is different from the semiconductor device in FIG. 11A in that the transistor 280, the first wiring 3001, and the second wiring 3002 are not provided. Also in this case, writing and retaining operation of data can be performed in a manner similar to that of the semiconductor device in FIG. 11A.

Reading of data in the semiconductor device in FIG. 11B is described. When the transistor 400 is turned on, the third wiring 3003 which is in a floating state and the capacitor 80 are electrically connected to each other, and the charge is redistributed between the third wiring 3003 and the capacitor 80. As a result, the potential of the third wiring 3003 is changed. The amount of change in the potential of the third wiring 3003 varies depending on the potential of the one electrode of the capacitor 80 (or the charge accumulated in the capacitor 80).

For example, the potential of the third wiring 3003 after the charge redistribution is $(C_B \times V_{B0} + C \times V)/(C_B + C)$, where V is the potential of the one electrode of the capacitor 80, C is the capacitance of the capacitor 80, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 80 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor containing the first semiconductor material is used in a driver circuit for driving a memory cell, and a transistor containing the second semiconductor material is stacked over the driver circuit as the transistor 400.

When a transistor having a channel formation region formed using an oxide semiconductor and having an extremely low off-state current is used in the semiconductor device in this embodiment, the semiconductor device can store data for an extremely long time. In other words, refresh operation becomes unnecessary or the frequency of the refresh operation can be extremely lowered, which leads to a sufficient reduction in power consumption. In addition, stored data can be retained for a long period even during a period in which power is not supplied (the potential is preferably fixed).

Furthermore, in the semiconductor device described in this embodiment, high voltage is not needed for writing data and there is no problem of element deterioration. For example, unlike a conventional nonvolatile memory, it is not necessary to inject and extract electrons into and from a floating gate, and thus a problem such as deterioration of a gate insulating film does not arise at all. That is, the semiconductor device described in this embodiment does not have a limit on the number of times data can be rewritten, which is a problem of a conventional nonvolatile memory, and the reliability thereof is drastically improved. Furthermore, since data is written by turning on or off the transistors, high-speed operation can be easily achieved.

The semiconductor device in FIG. 11C is different from the semiconductor device in FIG. 11A in that the transistor 290 and a sixth wiring 3006 are included. Also in this case, data can be written and retained in a manner similar to that of the semiconductor device in FIG. 11A. A transistor similar to the transistor 280 described above can be used as the transistor 290.

The sixth wiring 3006 is electrically connected to a gate of the transistor 290, one of a source and a drain of the transistor 290 is electrically connected to the source of the transistor 280, and the other of the source and the drain of the transistor 290 is electrically connected to the third wiring 3003.

The above memory device can also be used in an LSI such as a digital signal processor (DSP), a custom LSI, or a programmable logic device (PLD) and a radio frequency (RF) tag, in addition to a central processing unit (CPU), for example.

<Structure 1 of Semiconductor Device (Memory Device)>

The structure of a semiconductor device (memory device) of one embodiment of the present invention is described below.

Figure 12A:
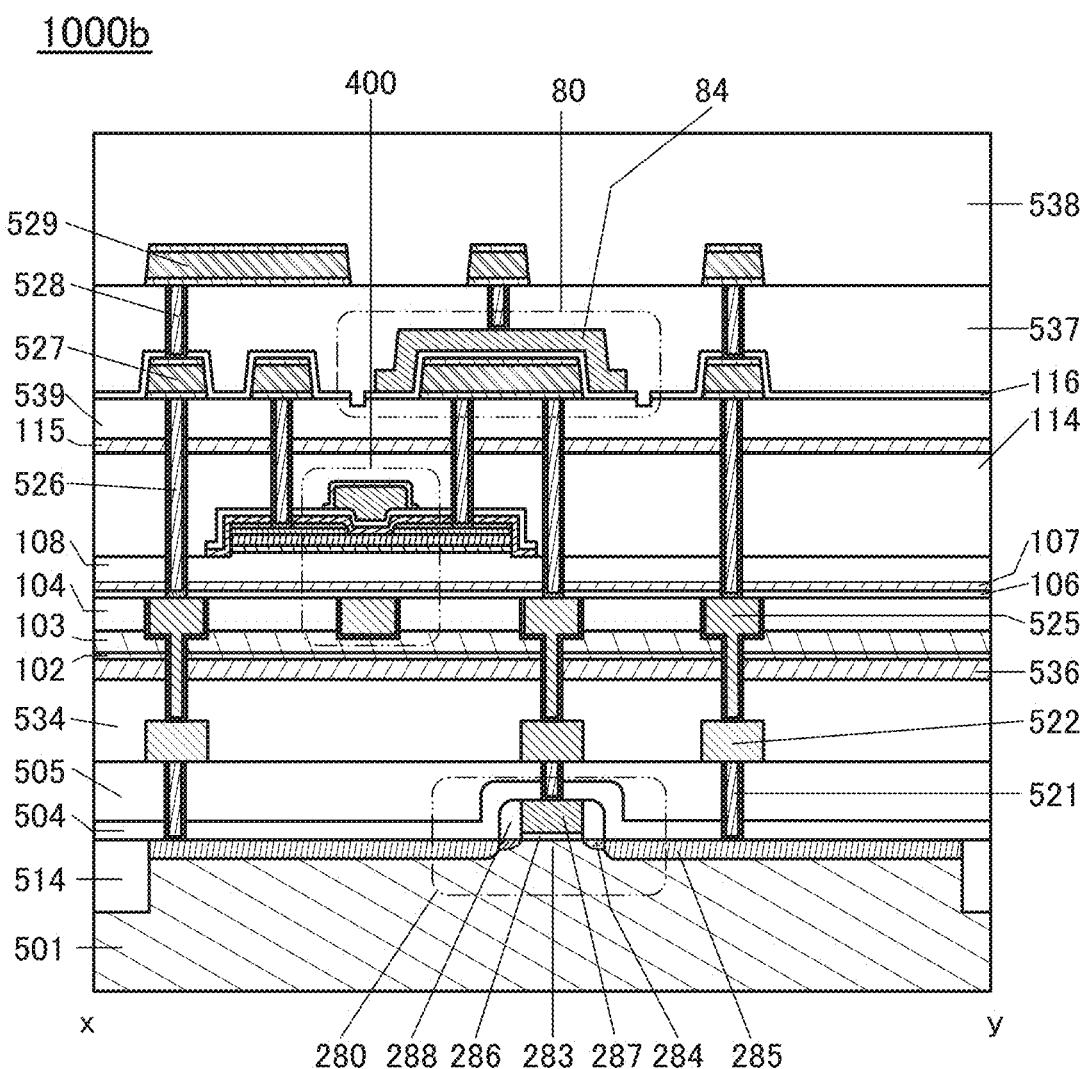
FIGS. 12A and 12B are a cross-sectional view and a top view illustrating a structure of a semiconductor device (a memory device) of one embodiment of the present invention.
Figure 12B:
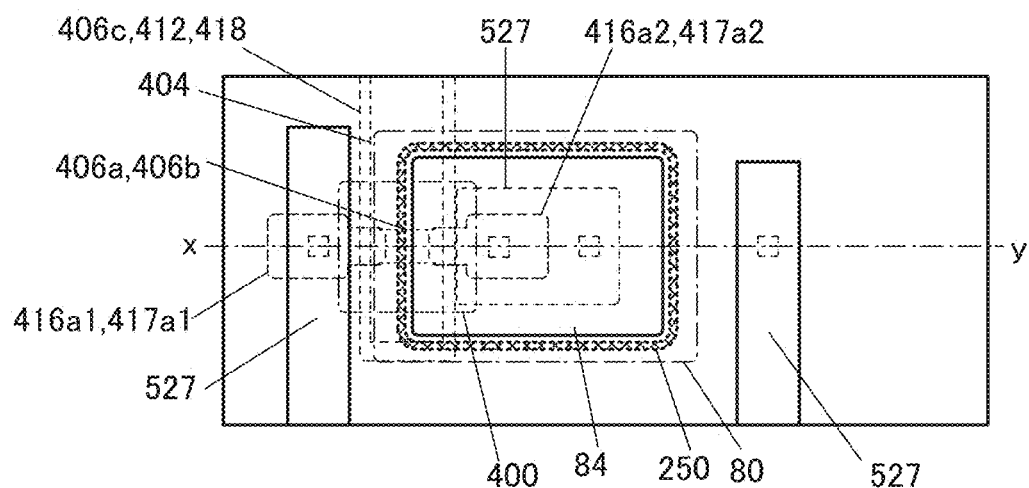

FIGS. 12A and 12B are a top view and a cross-sectional view of a semiconductor device 1000b of one embodiment of the present invention. FIG. 12B is a top view of the semiconductor device 1000b. FIG. 12A is a cross-sectional view along dashed-dotted line x-y in FIG. 12B. For simplification of the drawing, some components are not illustrated in the top view in FIG. 12B.

The semiconductor device 1000b includes the transistor 400, the transistor 280, and the capacitor 80. The transistor 400, the transistor 280, and the capacitor 80 in FIGS. 12A and 12B correspond to the transistor 400, the transistor 280, and the capacitor 80 in FIG. 11A, respectively.

In the semiconductor device 1000b, an n-type semiconductor is used for a substrate 501. The transistor 280 includes a channel formation region 283, high-concentration p-type impurity regions 285, an insulator 286, a conductor 287, and a sidewall 288. In regions overlapping with the sidewall 288, low-concentration p-type impurity regions 284 are provided. The insulator 286 can function as a gate insulator. The conductor 287 can function as a gate conductor. The channel formation region 283 of the transistor 280 is formed in part of the substrate 501.

The low-concentration p-type impurity regions 284 can be formed in such a manner that an impurity element is added with the use of the conductor 287 as a mask after formation of the conductor 287 and before the formation of the sidewall 288. In other words, the low-concentration p-type impurity regions 284 can be formed in a self-aligned manner. After the sidewall 288 is formed, the high-concentration p-type impurity regions 285 are formed. Note that the low-concentration p-type impurity regions 284 have the same conductivity type as the high-concentration p-type impurity regions 285, and have a lower concentration of the impurity imparting the conductivity type than the high-concentration p-type impurity regions 285. The low-concentration p-type impurity regions 284 are not necessarily provided depending on circumstances.

The transistor 280 is electrically isolated from other transistors by an element isolation region 514. The element isolation region can be formed by a local oxidation of silicon (LOCOS) method, a shallow trench isolation (STI) method, or the like.

In the semiconductor device 1000b, an insulator 534 and an insulator 536 are provided over an insulator 504 and an insulator 505 covering the transistor 280. In addition, the semiconductor device 1000b includes a conductor 522 over the insulator 505.

The conductor 522 is electrically connected to the transistor 280 through a conductor 521 provided in part of the insulators 504 and 505.

A wiring layer may be provided over the insulator 536. For example, an insulator 102, an insulator 103, and an insulator 104 are sequentially stacked in FIG. 12A. A conductor 525 is formed in the insulator 104, the insulator 103, the insulator 102, the insulator 536, and the insulator 534. The conductor 525 functions as a plug or a wiring.

Furthermore, the semiconductor device 1000b includes the transistor 400 over the insulator 536 with the insulator 102, the insulator 103, the insulator 104, an insulator 106, an insulator 107, and an insulator 108 provided therebetween. In addition, insulators 114, 115, and 539 are provided over the transistor 400, and a conductor 527, an insulator 116, and the capacitor 80 are provided over the insulator 539. The capacitor 80 includes the conductor 527, the insulator 116, and the conductor 84. Furthermore, the insulator 537 covering the conductor 527, the insulator 116, and the capacitor 80 is included.

The conductor 527 functions as one electrode of the capacitor 80 and the conductor 84 functions as the other electrode of the capacitor 80. Furthermore, in the insulator 116, a region sandwiched between the conductors 527 and 84 functions as a dielectric.

The conductor 527 is electrically connected to a source or a drain of the transistor 400 through a conductor 526 provided in part of the insulators 539, 115, and 114 and a barrier film 417.

A conductor 529 is provided over the insulator 537, and an insulator 538 is provided over the conductor 529. The conductor 529 is electrically connected to the conductor 84 through a conductor 528 provided in part of the insulator 537.

The insulators 102, 103, 104, 106, 107, 108, 114, 115, 116, 534, 536, 539, 537, and 538 can be formed using a material and a method which are similar to those of the insulators described in the above embodiment and the like. The conductors 521, 522, 525, 526, 527, 528, and 529 can be formed using a material and a method which are similar to those of the conductors described in the above embodiment and the like.

The conductors 521, 522, 525, 526, 527, 528, and 529 may be formed by a damascene method, a dual damascene method, or the like.

<Structure 2 of Semiconductor Device (Memory Device)>

Figure 13A:
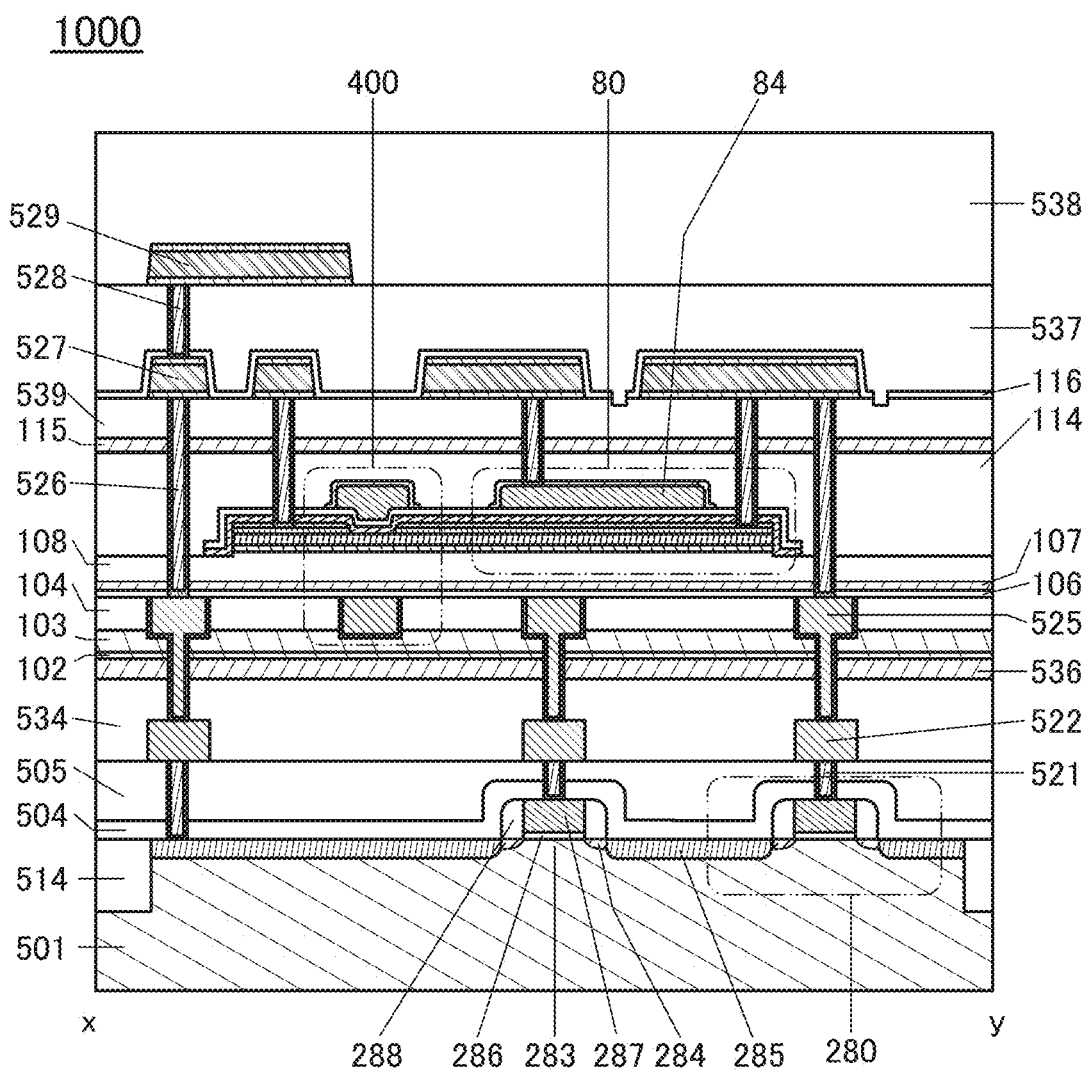
FIGS. 13A and 13B are a cross-sectional view and a top view illustrating a structure of a semiconductor device (a memory device) of one embodiment of the present invention.
Figure 13B:
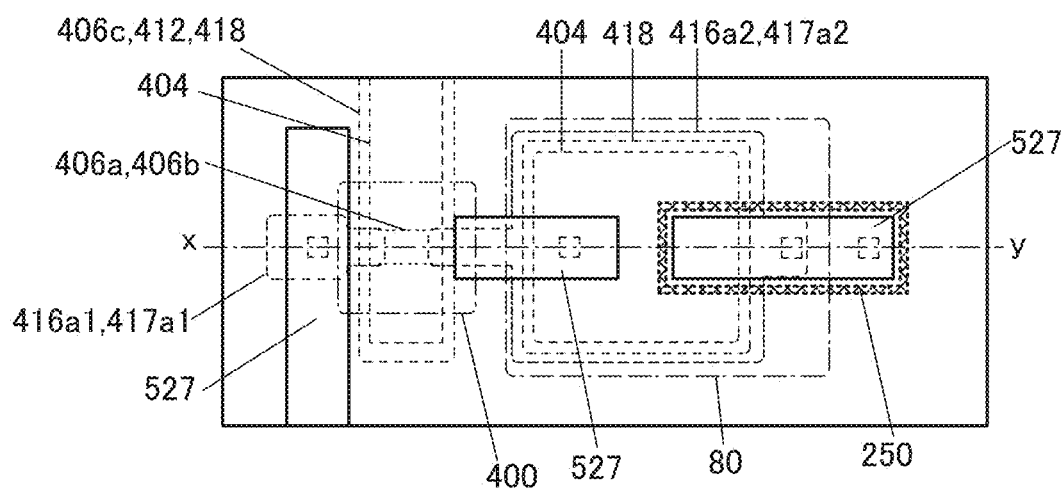

A semiconductor device 1000 illustrated in FIGS. 13A and 13B is different from the semiconductor device 1000b in FIGS. 12A and 12B in that the capacitor 80 is formed in the same layer as the transistor 400.

FIGS. 13A and 13B are a top view and a cross-sectional view of the semiconductor device 1000 of one embodiment of the present invention. FIG. 13B is a top view of the semiconductor device 1000. FIG. 13A is a cross-sectional view taken along dashed-dotted line x-y in FIG. 13A. For simplification of the drawing, some components are not illustrated in the top view of FIG. 13B.

The semiconductor device 1000 includes the transistor 400, the transistor 280, and the capacitor 80. The transistor 400, the transistor 280, and the capacitor 80 in FIGS. 13A and 13B correspond to the transistor 400, the transistor 280, and the capacitor 80 in FIG. 11A, respectively.

As illustrated in FIGS. 13A and 13B, one of the source and the drain of the transistor 400 functions as one electrode of the capacitor 80, and the conductor 84 functions as the other electrode of the capacitor 80. In this case, regions of the barrier film (e.g., the barrier film 417a2), the oxide (e.g., the oxide 406c), and the gate insulating film (e.g., the insulator 412) of the transistor 400 that extend over the conductor serving as one of the source and the drain of the transistor 400 function as a dielectric of the capacitor 80. That is, a region where the conductor 84 and the conductor serving as one of the source and the drain of the transistor 400 overlap with each other with the barrier film, the oxide, and the gate insulating film of the transistor 400 provided therebetween functions as the capacitor 80.

With the above structure, in the case where the capacitor 80 is formed in parallel with the transistor 400, the capacitor 80 can be formed without increasing a manufacturing step.

According to one embodiment of the present invention, the leakage current between the memory cells can be reduced. That is, according to one embodiment of the present invention, a memory device with high productivity can be provided. According to one embodiment of the present invention, a memory device which can retain data for a long period even when power supply is stopped can be provided. For example, a memory device which can retain data for a year or more, ten years or more after power supply is stopped can be provided. Thus, a memory device of one embodiment of the present invention can be regarded as a nonvolatile memory. The structure described in this embodiment can be used in appropriate combination with the structure described in any of the other embodiments. The structure can be used in electronic devices. For example, the structure can be used in a memory device included in an electronic device and a CPU. Furthermore, the structure can be used in a display device. For example, the structure can be used in a pixel circuit and a driver circuit of a display device.

Note that this embodiment can be combined with any of the other embodiments as appropriate.

Embodiment 3

In this embodiment, an example of a semiconductor device of one embodiment of the present invention is described.

Figure 14A:
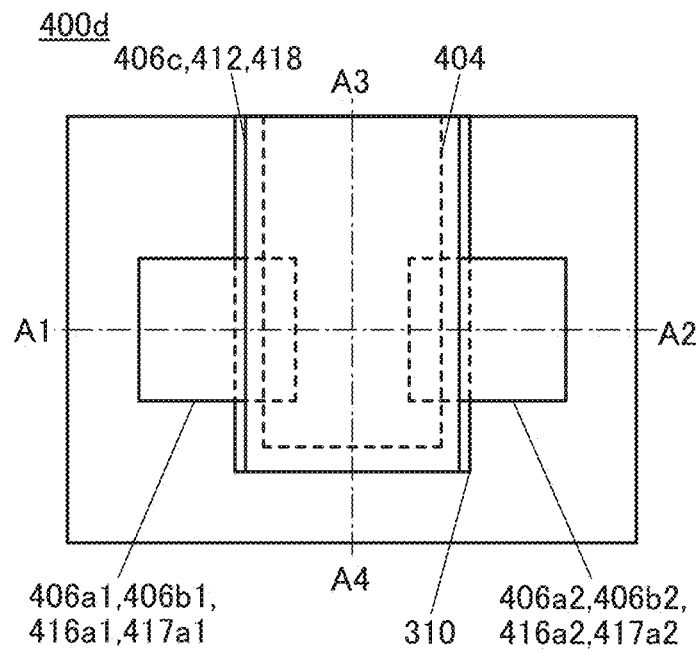
FIGS. 14A to 14C illustrate a transistor used in a semiconductor device of one embodiment of the present invention.
Figure 14C:
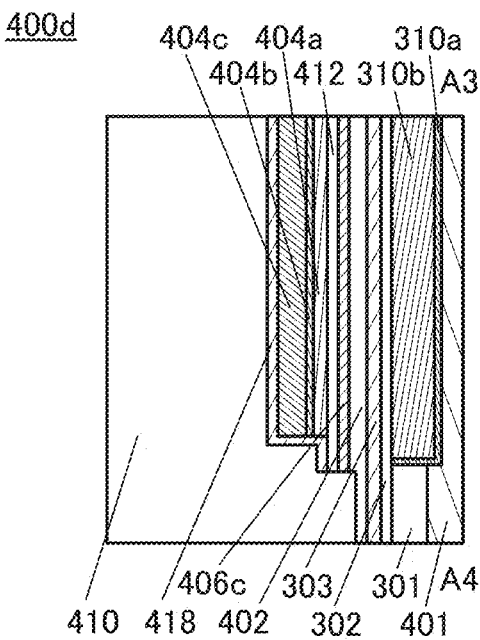
Figure 14B:
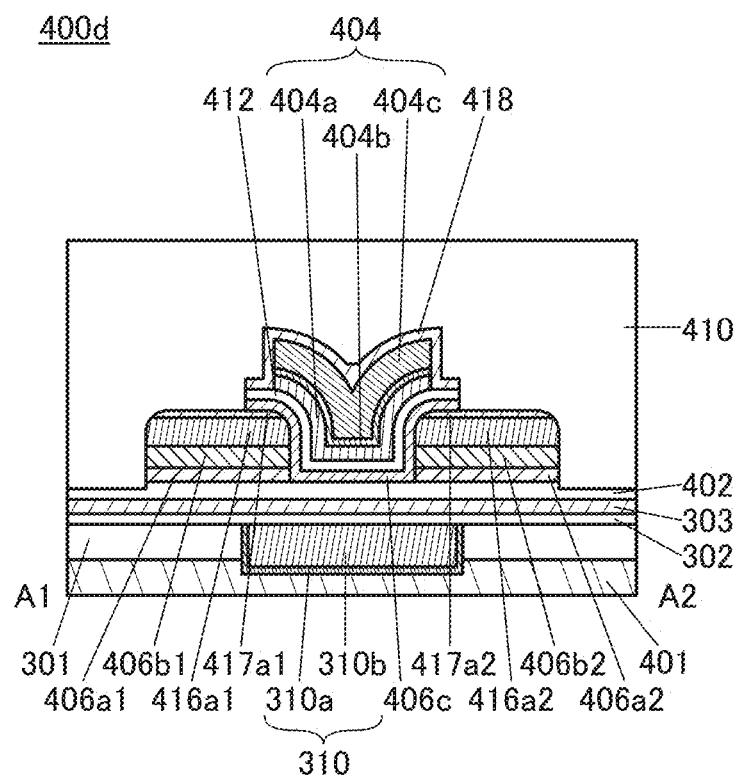

Next, a transistor 400d illustrated in FIGS. 14A to 14C is described. FIGS. 14A to 14C are a top view and cross-sectional views of the transistor 400d. FIG. 14A is a top view of the transistor 400d. FIG. 14B is a cross-sectional view taken along dashed-dotted line A1-A2 in FIG. 14A. FIG. 14C is a cross-sectional view taken along dashed-dotted line A3-A4 in FIG. 14A. Note that for simplification of the drawing, some components are not illustrated in the top view of FIG. 14A.

The transistor 400d can be fabricated in parallel with the above transistor 400a or the like. In the case where the transistor 400d is fabricated in parallel with the transistor 400a, the transistor 400d can be fabricated without an extra step.

The transistor 400d is different from the transistor 400a in including an oxide 406a1 and an oxide 406a2 that are separate from each other and provided over the insulator 402, an oxide 406b1 that is in contact with a top surface of the oxide 406a1, and an oxide 406b2 that is in contact with a top surface of the oxide 406a2, and in that the oxide 406c is in contact with the top surface of the insulator 402, side surfaces of the oxide 406a1 and the oxide 406a2, and side surfaces of the oxide 406b1 and the oxide 406b2.

The oxides 406a1 and 406a2 and the oxides 406b1 and 406b2 can be formed using materials similar to those of the oxides 406a and 406b of the transistor 400a. The oxides 406a1 and 406b1 are opposite the oxides 406a2 and 406b2, with the oxide 406c, the insulator 412, and the conductor 404 therebetween.

The conductor 416a1 can be formed to overlap with the oxide 406a1 and the oxide 406b1, and the conductor 416a2 can be formed to overlap with the oxide 406a2 and the oxide 406b2. The oxides 406a1 and 406b1 and the oxides 406a2 and 406b2 can serve as source and drain regions of the transistor 400d.

The oxide 406c of the transistor 400d can be formed using a material similar to that of the oxide 406c of the transistor 400a. A region of the oxide 406c that is sandwiched between the oxides 406a1 and 406a2 and between the oxides 406b1 and 406b2 serves as a channel formation region.

In the oxide 406c serving as an active layer of the transistor 400d, oxygen vacancies and impurities such as hydrogen and water are reduced as in the oxide 406c or the like of the transistor 400a. Thus, the threshold voltage of the transistor 400d can be higher than 0 V, the off-state current can be reduced, and $I_{cut}$ can be noticeably reduced. Here, $I_{cut}$ is a drain current when a gate voltage that controls switching operation of a transistor is 0 V. Furthermore, when the distance between the conductor 416a1 and the conductor 416a2 in the transistor 400d is longer than the distance between the conductor 416a1 and the conductor 416a2 in the transistor 400a, the transistor 400d can have a higher threshold voltage, a lower off-state current, and a lower $I_{cut}$ than the transistor 400a.

The transistor 400d is capable of controlling the back gate voltage of the transistor 400a or the like. For example, a top gate and a back gate of the transistor 400d are diode-connected to a source of the transistor 400d, and the source of the transistor 400d and the back gate of the transistor 400a are connected to each other. When the negative potential of the back gate of the transistor 400a is retained in the structure, the top gate-source voltage and the back gate-source voltage of the transistor 400d are each 0 V. Since the $I_{cut}$ of the transistor 400d is extremely small, the structure allows the negative potential of the back gate of the transistor 400a to be held for a long time without power supply to the transistor 400a and the transistor 400d.

As described above, one embodiment of the present invention can provide a semiconductor device having favorable reliability.

As described above, the structures, methods, and the like described in this embodiment can be combined with any of the structures, methods, and the like described in the other embodiments as appropriate.

Embodiment 4

In this embodiment, electronic devices each including the transistor or the like of one embodiment of the present invention are described.
<Electronic Device>
A semiconductor device of one embodiment of the present invention can be used in a variety of electronic devices. FIGS. 15A to 15F illustrate specific examples of the electronic devices using a semiconductor device of one embodiment of the present invention.

Figure 15A:
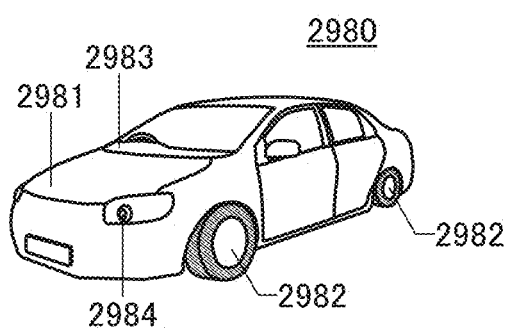
FIGS. 15A to 15F each illustrate an electronic device of one embodiment of the present invention.

FIG. 15A is an external view illustrating an example of a car. A car 2980 includes a car body 2981, wheels 2982, a dashboard 2983, lights 2984, and the like. The car 2980 includes an antenna, a battery, and the like.

Figure 15B:
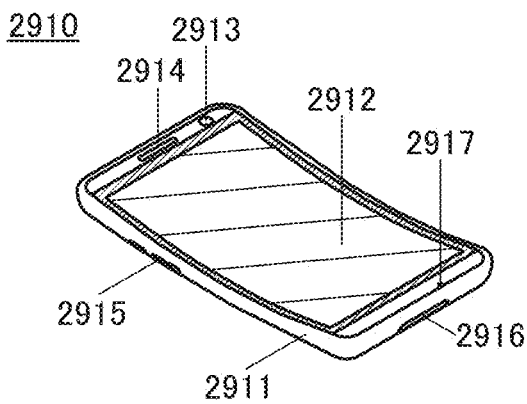

An information terminal 2910 illustrated in FIG. 15B includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912. In addition, the information terminal 2910 includes an antenna, a battery, and the like inside the housing 2911. The information terminal 2910 can be used as, for example, a smartphone, a mobile phone, a tablet information terminal, a tablet personal computer, or an e-book reader.

Figure 15C:
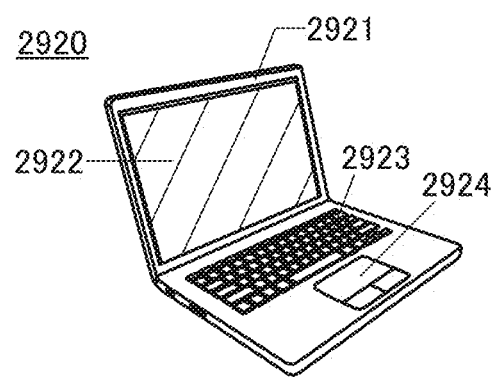

A notebook personal computer 2920 illustrated in FIG. 15C includes a housing 2921, a display portion 2922, a keyboard 2923, a pointing device 2924, and the like. In addition, the notebook personal computer 2920 includes an antenna, a battery, and the like inside the housing 2921.

Figure 15D:
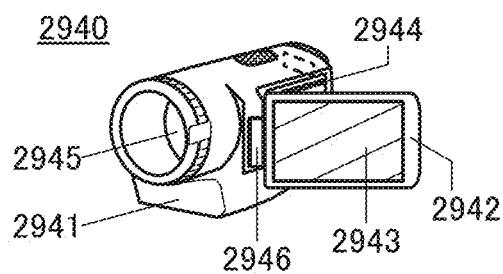

A video camera 2940 illustrated in FIG. 15D includes a housing 2941, a housing 2942, a display portion 2943, operation switches 2944, a lens 2945, a joint 2946, and the like. The operation switches 2944 and the lens 2945 are provided for the housing 2941, and the display portion 2943 is provided for the housing 2942. In addition, the video camera 2940 includes an antenna, a battery, and the like inside the housing 2941. The housing 2941 and the housing 2942 are connected to each other with the joint 2946, and the angle between the housing 2941 and the housing 2942 can be changed with the joint 2946. The orientation of an image on the display portion 2943 can be changed and display and non-display of an image can be switched depending on the angle between the housings 2941 and 2942.

Figure 15E:
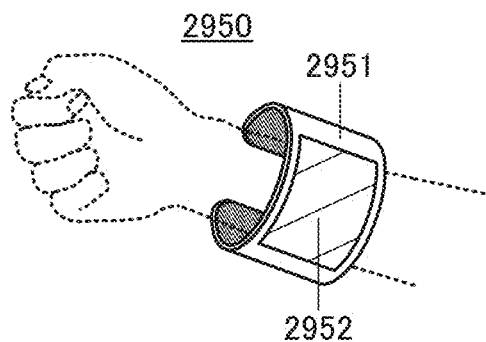

FIG. 15E illustrates an example of a bangle-type information terminal. An information terminal 2950 includes a housing 2951, a display portion 2952, and the like. In addition, the information terminal 2950 includes an antenna, a battery, and the like inside the housing 2951. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 15F:
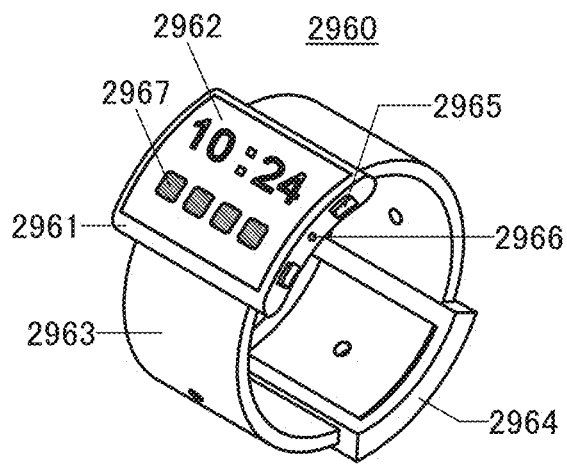

FIG. 15F illustrates an example of a watch-type information terminal. An information terminal 2960 includes a housing 2961, a display portion 2962, a band 2963, a buckle 2964, an operation switch 2965, an input/output terminal 2966, and the like. In addition, the information terminal 2960 includes an antenna, a battery, and the like inside the housing 2961. The information terminal 2960 is capable of executing a variety of applications such as mobile phone calls, e-mailing, text viewing and editing, music reproduction, Internet communication, and computer games.

The display surface of the display portion 2962 is curved, and images can be displayed on the curved display surface. Furthermore, the display portion 2962 includes a touch sensor, and operation can be performed by touching the screen with a finger, a stylus, or the like. For example, an application can be started by touching an icon 2967 displayed on the display portion 2962. With the operation switch 2965, a variety of functions such as time setting, ON/OFF of the power, ON/OFF of wireless communication, setting and cancellation of a silent mode, and setting and cancellation of a power saving mode can be performed. For example, the functions of the operation switch 2965 can be set by setting the operating system incorporated in the information terminal 2960.

The information terminal 2960 can employ near field communication that is a communication method based on an existing communication standard. For example, mutual communication between the portable information terminal 2960 and a headset capable of wireless communication can be performed, and thus hands-free calling is possible. Moreover, the information terminal 2960 includes the input/output terminal 2966, and data can be directly transmitted to and received from another information terminal via a connector. Power charging through the input/output terminal 2966 is possible. Note that the charging operation may be performed by wireless power feeding without using the input/output terminal 2966.

A memory device including the semiconductor device of one embodiment of the present invention can hold control data, a control program, or the like of the above electronic device for a long time. With the use of the semiconductor device of one embodiment of the present invention, a highly reliable electronic device can be provided.

The structures described in this embodiment can be implemented in an appropriate combination with any of the structures described in the other embodiments, Example, and the like.

Example

In this example, a residue formed when a wiring containing aluminum (Al) as an example of the metal A, which is described in Embodiment 1, is formed was estimated.

<Structure of Samples>

In this section, structures of samples 1A to 1D, which are used in this example, are described.

Figure 16A:
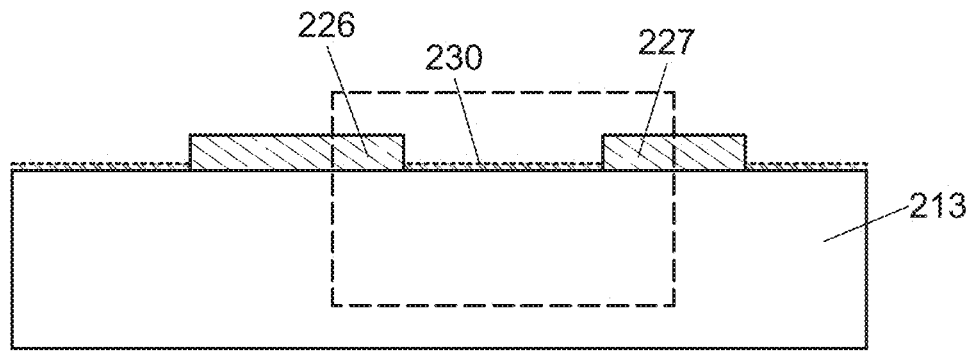
FIGS. 16A to 16E are a schematic cross-sectional view and cross-sectional STEM images of evaluation examples.

Each of the samples 1A to 1D has a structure illustrated in FIG. 16A. The structure includes the insulator 213, the conductor 226, and the conductor 227.

First, as a substrate (not illustrated), silicon wafer was prepared. Then, as the insulator 213, a 100-nm-thick silicon oxide film was deposited by a thermal oxidation method.

Next, a 20-nm-thick first titanium film was deposited over the insulator 213 by a sputtering method, a 30-nm-thick first titanium nitride film was deposited over the first titanium film by a sputtering method, a 100-nm-thick aluminum film was deposited over the first titanium nitride film by a sputtering method, a 5-nm-thick second titanium film was deposited over the aluminum film by a sputtering method, and a 45-nm-thick second titanium nitride film was deposited over the second titanium film by a sputtering method. Through these steps, the conductor 225 having a stacked-layer structure of the first titanium film, the first titanium nitride film, the aluminum film, the second titanium film, and the second titanium nitride film was formed.

Then, a resist mask was formed in a pattern over the conductor 225 by a lithography method.

Then, the sample was subjected to first treatment and second treatment through the resist mask, whereby etching was performed. The conditions of the first treatment were as follows: the pressure was 1.9 Pa; the power of the upper electrode was 450 W; the bias power was 100 W; the mixed atmosphere of $BCl_3$ with a flow rate of 60 sccm and $Cl_2$ with a flow rate of 20 sccm was used; and the substrate temperature was 70° C. The first treatment was further performed for 60 seconds after an endpoint was detected by a device.

The second treatment was performed for 15 seconds under the following conditions: the pressure was 2.0 Pa; the power of the upper electrode was 500 W; the bias power was 50 W; the atmosphere of $CF_4$ with a flow rate of 80 sccm was used; and the substrate temperature was 70° C.

By the above etching, the conductor 225 was processed to form the conductors 226 and 227. A sample right after the etching is referred to as a sample 1A.

Next, washing treatment using pure water (hereinafter referred to as pure water washing) was performed. A sample after the pure water washing is referred to as a sample 1B.

The sample 1B was subjected to first ashing. The first ashing was performed for 15 seconds under the following conditions: a pressure of 0.67 Pa; a power supply of 2000 W; a bias power of 50 W; and under an atmosphere of $O_2$ with a flow rate of 200 sccm.

Then, second ashing was performed. The second ashing was performed for 15 seconds under the following conditions: a pressure of 12.0 Pa; a power supply of 2000 W; a bias power of 0 W; and under an atmosphere of $O_2$ with a flow rate of 200 sccm. A sample after being subjected to the second ashing is referred to as a sample 1C.

The resist mask of the sample 1C was removed using a resist stripper. A sample after the resist mask was removed is referred to as a sample 1D.

Cross sections of the samples 1A to 1D were observed. Furthermore, the samples 1A to 1D were subjected to elementary analysis, whereby the presence or absence of the residue of aluminum (Al) was checked.

<Cross-Sectional Observation of Samples>

Figure 16B:
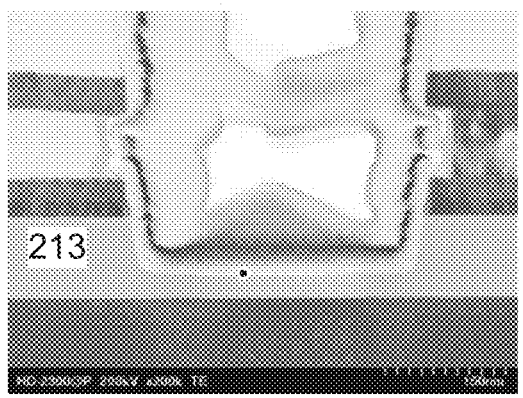
Figure 16C:
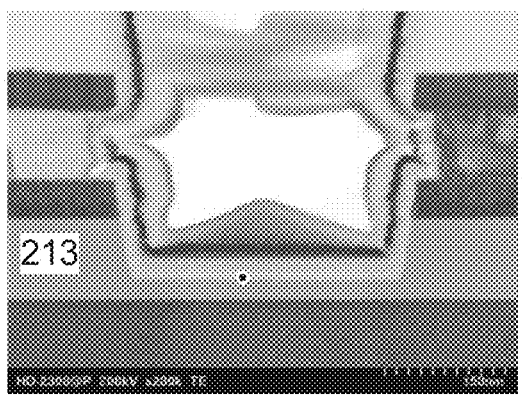
Figure 16D:
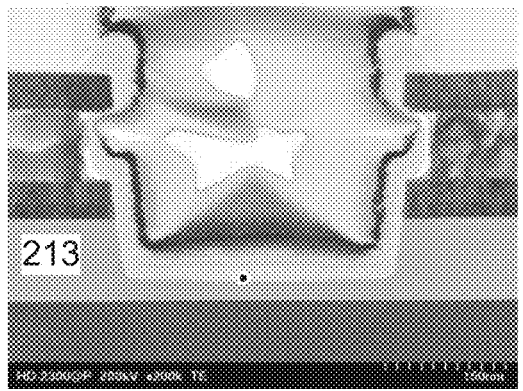
Figure 16E:
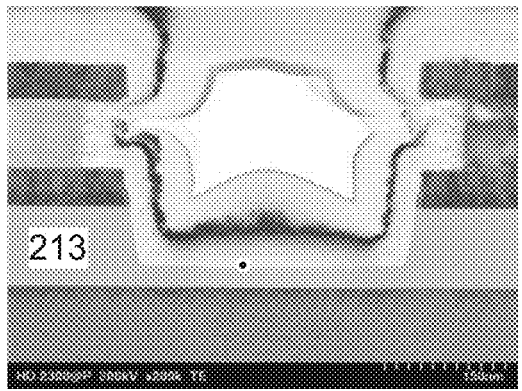

The cross-sectional observation of the samples 1A to 1D was performed with a scanning transmission electron microscope (STEM). As an apparatus for observation, HD-2300 manufactured by Hitachi High-Technologies Corporation was used. The accelerating voltage was 200 kV. FIG. 16B shows a cross-sectional STEM image of the sample 1A in a region surrounded by a dotted line in FIG. 16A. FIG. 16C shows a cross-sectional STEM image of the sample 1B in a region surrounded by a dotted line in FIG. 16A. FIG. 16D shows a cross-sectional STEM image of the sample 1C in a region surrounded by a dotted line in FIG. 16A. FIG. 16E shows a cross-sectional STEM image of the sample 1D in a region surrounded by a dotted line in FIG. 16A.

FIGS. 16B to 16E show that, in each of the samples 1A to 1D, the conductor 226 and the conductor 227 are formed. In addition, it is also shown that part of the surface of the insulator 213 is removed. Note that in the cross-sectional STEM images of the samples 1A to 1D, the residue 230 of Al cannot be observed on the surface of the insulator 213.

<Elementary Analysis of Samples>

Elementary analysis of the surface region in the insulator 213 of each of the samples 1A to 1D was performed with the EDX. As an apparatus for EDX measurement, HD-2300 manufactured by Hitachi High-Technologies Corporation was used. As an apparatus for elementary analysis, an EDX Si(Li) detector manufactured by EDAX Inc. was used.

In the EDX measurement, an EDX spectrum of a point is obtained in such a manner that electron beam irradiation is performed on the point in a detection target region of a sample, and the energy of characteristic X-ray of the sample generated by the irradiation and its frequency are measured. In this example, peaks of EDX spectra of the surface regions in the insulators 213, which are shown by the points in FIGS. 16B to 16E, were each attributed to electron transition to the K shell in a C atom, electron transition to the K shell in an O atom, electron transition to the K shell in an F atom, electron transition to the K shell in an Al atom, electron transition to the K shell in a Si atom, electron transition to the M shell in a Pt atom, electron transition to the K shell in a Cu atom, and electron transition to the K shell in a Ga atom, and the proportions of the atoms in the points were calculated.

Table 1 shows the proportions of the atoms in the surface region of the insulator 213 of each of the samples 1A to 1D.

TABLE 1

| Atom (Shell) | Sample 1A | | Sample 1B | | Sample 1C | | Sample 1D | |
|---|---|---|---|---|---|---|---|---|
| | weight % | atomic % | weight % | atomic % | weight % | atomic % | weight % | atomic % |
| C (K) | 33.0 | 52.4 | 13.4 | 24.4 | 18.2 | 31.3 | 18.1 | 30.8 |
| O (K) | 17.7 | 21.0 | 24.6 | 33.7 | 24.9 | 32.1 | 24.4 | 31.3 |
| F (K) | 0.8 | 0.8 | 0.8 | 0.9 | 0.9 | 0.9 | 1.2 | 1.3 |
| Al (K) | 0.7 | 0.5 | 1.3 | 1.0 | 2.4 | 1.8 | 4.8 | 3.6 |
| Si (K) | 30.8 | 20.9 | 45.5 | 35.5 | 40.8 | 29.9 | 41.6 | 30.4 |

TABLE 1-continued

| Atom | Sample 1A | | Sample 1B | | Sample 1C | | Sample 1D | |
|---|---|---|---|---|---|---|---|---|
| (Shell) | weight % | atomic % | weight % | atomic % | weight % | atomic % | weight % | atomic % |
| Pt (M) | 3.2 | 0.3 | 1.2 | 0.1 | 0.5 | 0.1 | 2.3 | 0.2 |
| Cu (K) | 8.8 | 2.6 | 9.4 | 3.2 | 7.1 | 2.3 | 5.9 | 1.9 |
| Ga (K) | 5.0 | 1.4 | 3.9 | 1.2 | 4.4 | 1.3 | 1.8 | 0.5 |

As shown in Table 1, the proportion of Al atoms in the surface region of the insulator 213 of the sample 1A is 0.5 atomic %. Furthermore, the proportion of Al atoms in the surface region of the insulator 213 of the sample 1B is 1.0 atomic %. Furthermore, the proportion of Al atoms in the surface region of the insulator 213 of the sample 1C is 1.8 atomic %. Furthermore, the proportion of Al atoms in the surface region of the insulator 213 of the sample 1D is 3.6 atomic %. The proportion of Al atoms in the surface region of the insulator 213 of the sample 1B is higher than that of the sample 1A. That is, it is found that by performing pure water washing, the residue 230 of Al is formed on the surface of the insulator 213. In addition, the proportion of Al atoms in the surface region of the insulator 213 of each of the samples 1C and 1D is higher than that of the sample 1A. That is, it is found that by ashing with oxygen and removing the resist mask using a resist stripper, the residue 230 of Al on the surface of the insulator 213 is formed.

The structure described in this example can be used as appropriate in combination with any of the embodiments.

This application is based on Japanese Patent Application Serial No. 2017-059440 filed with Japan Patent Office on Mar. 24, 2017, the entire contents of which are hereby incorporated by reference.

What is claimed is:

1. A semiconductor device comprising:
a first insulator;
a first conductor over the first insulator;
a second conductor over the first insulator;
a second insulator over the first insulator and overlapping the first conductor, with the first conductor being between the second insulator and the first insulator; and
a third insulator over the first insulator and overlapping the second conductor, with the second conductor being between the third insulator and the first insulator,
wherein the second insulator comprises the same material as the third insulator,
wherein the third insulator surrounds is spaced from the second insulator with a gap therebetween,
wherein the first conductor and the second conductor comprise a metal A,
wherein the metal A is one kind or a plurality of kinds of aluminum, copper, tungsten, chromium, silver, gold, platinum, tantalum, nickel, molybdenum, magnesium, beryllium, indium, and ruthenium,
wherein the metal A is detected in an interface between the first insulator and the second insulator and in an interface between the first insulator and the third insulator by an energy dispersive X-ray spectroscopy (EDX), and
wherein a region of the first insulator exposed from the gap comprises a groove.

2. The semiconductor device according to claim 1, further comprising a first transistor,
wherein the first conductor is electrically connected to one of a source and a drain of the first transistor.

3. The semiconductor device according to claim 2,
wherein a channel formation region of the first transistor is formed in a metal oxide.

4. The semiconductor device according to claim 2, further comprising a capacitor,
wherein the first conductor is electrically connected to one electrode of the capacitor.

5. The semiconductor device according to claim 1,
wherein the first conductor and the second conductor comprise at least one of aluminum and copper.

6. A semiconductor device comprising:
a first insulator;
a first conductor over the first insulator;
a second conductor over the first insulator;
a second insulator over the first insulator and overlapping the first conductor, with the first conductor being between the second insulator and the first insulator;
a third insulator over the first insulator and the second conductor, with the second conductor being between the third insulator and the first insulator; and
a capacitor,
wherein the second insulator comprises the same material as the third insulator,
wherein the third insulator is spaced from the second insulator with a gap therebetween,
wherein the first conductor and the second conductor comprise a metal A,
wherein the metal A is one kind or a plurality of kinds of aluminum, copper, tungsten, chromium, silver, gold, platinum, tantalum, nickel, molybdenum, magnesium, beryllium, indium, and ruthenium,
wherein the first conductor serves as one electrode of the capacitor,
wherein the metal A is detected in an interface between the first insulator and the second insulator and in an interface between the first insulator and the third insulator by an EDX, and
wherein a region of the first insulator exposed from the gap comprises a groove.

7. The semiconductor device according to claim 6, further comprising a first transistor,
wherein the first conductor is electrically connected to one of a source and a drain of the first transistor.

8. The semiconductor device according to claim 7,
wherein a channel formation region of the first transistor is formed in a metal oxide.

9. The semiconductor device according to claim 6,
wherein the second insulator serves as a dielectric of the capacitor.

10. The semiconductor device according to claim 6,
wherein the first conductor and the second conductor comprise at least one of aluminum and copper.

* * * * *